U S009257306B2

(12) United States Patent
Shibasaki et al.

(10) Patent No.: US 9,257,306 B2
(45) Date of Patent: Feb. 9, 2016

(54) LEAD FRAME, METHOD FOR MANUFACTURING LEAD FRAME, SEMICONDUCTOR DEVICE, AND METHOD FOR MANUFACTURING SEMICONDUCTOR DEVICE

(71) Applicant: DAI NIPPON PRINTING CO., LTD., Tokyo-to (JP)

(72) Inventors: Satoshi Shibasaki, Tokyo-to (JP); Koji Tomita, Tokyo-to (JP); Masaki Yazaki, Tokyo-to (JP); Kazuyuki Miyano, Tokyo-to (JP); Atsushi Kurahashi, Tokyo-to (JP); Kazuhito Uchiumi, Tokyo-to (JP); Masachika Masuda, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/254,543

(22) Filed: Apr. 16, 2014

(65) Prior Publication Data
US 2014/0319663 A1 Oct. 30, 2014

(30) Foreign Application Priority Data

Apr. 18, 2013 (JP) .................................. 2013-087695
Apr. 18, 2013 (JP) .................................. 2013-087713
Sep. 27, 2013 (JP) .................................. 2013-201321

(51) Int. Cl.
| H01L 23/495 | (2006.01) |
| H01L 21/48 | (2006.01) |
| H01L 23/00 | (2006.01) |
| H01L 21/56 | (2006.01) |
| H01L 23/31 | (2006.01) |

(52) U.S. Cl.
CPC ...... *H01L 21/4828* (2013.01); *H01L 23/49541* (2013.01); *H01L 23/49548* (2013.01); *H01L 23/49582* (2013.01); *H01L 24/97* (2013.01); *H01L 21/568* (2013.01); *H01L 23/3107* (2013.01); *H01L 2224/32245* (2013.01); *H01L 2224/48247* (2013.01); *H01L 2224/73265* (2013.01); *H01L 2224/83005* (2013.01); *H01L 2224/85005* (2013.01); *H01L 2224/92247* (2013.01); *H01L 2224/97* (2013.01); *H01L 2924/1301* (2013.01); *Y10T 29/49121* (2015.01)

(58) Field of Classification Search
CPC ............ H01L 23/495; H01L 23/49503; H01L 23/49513; H01L 23/49541; H01L 23/49537; H01L 23/49555; H01L 23/49548
USPC .................................. 257/666–677, E23.004, 257/E23.031–E23.059, E23.43
See application file for complete search history.

(56) References Cited

U.S. PATENT DOCUMENTS

| 6,686,651 B1 * | 2/2004 | Foster ............................ 257/666 |
| 2003/0001244 A1 * | 1/2003 | Araki et al. .................... 257/666 |
| 2005/0248041 A1 * | 11/2005 | Kuah et al. ..................... 257/787 |

FOREIGN PATENT DOCUMENTS

| JP | A-2001-189402 | 7/2001 |
| JP | A-2006-19767 | 1/2006 |
| JP | B2-3732987 | 1/2006 |

Primary Examiner — Jasmine Clark
(74) Attorney, Agent, or Firm — Oliff PLC

(57) ABSTRACT

A lead frame includes a die pad and a plurality of lead portions each including an internal terminal and an external terminal. The external terminals of the plurality of lead portions are arranged in an alternately staggered form such that the respective external terminals of a pair of lead portions adjacent to each other are alternatively located on an inside or an outside. A lead portion has an inside region located on the inside of a first external terminal, an outside region located on the outside of the first external terminal, and an external terminal region having the first external terminal. The inside region and the outside region are each formed thin by means of half etching. A maximum thickness of the outside region is larger than a maximum thickness of the inside region.

30 Claims, 26 Drawing Sheets

LEAD FRAME, METHOD FOR MANUFACTURING LEAD FRAME, SEMICONDUCTOR DEVICE, AND METHOD FOR MANUFACTURING SEMICONDUCTOR DEVICE

CROSS-REFERENCE TO RELATED APPLICATIONS

The present patent application claims the benefits of Japanese Patent Application No. 2013-087713, filed in Japan on Apr. 18, 2013, Japanese Patent Application No. 2013-087695, filed in Japan on Apr. 18, 2013, and Japanese Patent Application No. 2013-201321, filed in Japan on Sep. 27, 2013. The entire disclosed content of these prior applications is incorporated herein as part of the present specification by way of reference.

BACKGROUND OF THE INVENTION

1. Field of the Invention

The present invention relates to a lead frame and a method of manufacturing the same, and a semiconductor device and a method of manufacturing the same.

2. Description of the Related Art

There has recently been a demand for reductions in size and thickness of a semiconductor device mounted on a board. In order to meet such a demand, various semiconductor devices of a so-called QFN (Quad Flat Non-lead) type have conventionally been proposed which are formed by using a lead frame, sealing a semiconductor element mounted on a mounting surface of the lead frame with a sealing resin, and exposing a part of leads on a rear surface side.

As QFN is becoming common, power supply ICs and analog ICs as general-purpose packages have been mounted in many electronic apparatuses. In addition, there has recently been an increasing demand for QFN packages to have a larger number of pins, and thus packages of 100- to 200-pin types to be used for advanced power supplies, microcomputers, and basebands for communication and radio has been developed.

However, the package of a QFN having a conventional ordinary structure becomes larger as the number of terminals increases, making it difficult to ensure mounting reliability. The larger size of the package lengthens distance between internal terminals and a semiconductor chip, and therefore increases an amount of usage of bonding wires made of gold, so that the manufacturing cost of the package rises. In addition, an increase in length of the bonding wires may cause a problem at a time of package assembly.

In order to deal with these disadvantages, a package referred to as a DR-QFN (Dual Row QFN) having external terminals arranged in two rows as a technology for realizing a QFN having a larger number of pins has been developed (see for example JP-3732987, JP-2001-189402-A, and JP-2006-19767-A). Such a DR-QFN is provided with half-etched lead portions for supporting inside terminals. The DR-QFN however has the number of lead portions larger due to an increase in the number of pins, the lead portions inevitably being required be designed to have a small width. The small width may make the strength of the half-etched lead portions insufficient, possibly deforming the lead portions to cause displacement of external terminals. The yield of the lead frame may be consequently decreased.

SUMMARY OF THE INVENTION

The present invention has been made in view of such perspectives. It is an object of the present invention to provide a lead frame and a method of manufacturing the same, and a semiconductor device and a method of manufacturing the same, which make it possible to suppress a decrease in the strength of lead portions and prevent the lead portions from being deformed even when the width of the lead portions is narrower.

According to the present invention, there is provided a lead frame including: a die pad on which a semiconductor element is to be mounted; and a plurality of lead portions provided on a periphery of the die pad, the plurality of lead portions each including an internal terminal and an external terminal; wherein the external terminals of the plurality of lead portions are arranged in an alternately staggered form such that the respective external terminals of a pair of lead portions adjacent to each other are alternatively located on an inside or an outside; wherein the plurality of lead portions each have an inside region located on the inside of the external terminal, an outside region located on the outside of the external terminal, and an external terminal region having the external terminal formed on a rear surface of the external terminal region, respective rear surfaces of the inside region and the outside region of the lead portion, bearing at least the external terminal on the inside, are formed such that the inside region and the outside region are thinner than the external terminal region, and wherein a maximum thickness of the outside region of the lead portion with the external terminal located on the inside is larger than a maximum thickness of the inside region of the lead portion with the external terminal located on the inside.

According to the present invention, the inside region in the lead frame of the lead portion with the external terminal located on the inside has a flat rear surface, and has a substantially quadrilateral shape in a cross section orthogonal to a longitudinal direction of the lead portion with the external terminal located on the inside.

According to the present invention, the outside region in the lead frame of the lead portion with the external terminal located on the inside has a convexed portion projecting downward in a cross section orthogonal to a longitudinal direction of the lead portion with the external terminal located on the inside.

According to the present invention, the outside region in the lead frame of the lead portion with the external terminal located on the inside has a substantially pentagonal shape in the cross section orthogonal to the longitudinal direction of the lead portion with the external terminal located on the inside.

According to the present invention, the external terminals in the lead frame of the plurality of lead portions each have a larger width than a top surface of the external terminal region.

According to the present invention, there is provided a semiconductor device including: a die pad; a plurality of lead portions provided on a periphery of the die pad, the plurality of lead portions each including an internal terminal and an external terminal; a semiconductor element mounted on the die pad; bonding wires for electrically connecting the semiconductor element to the internal terminals of the lead portions; and a sealing resin for sealing the die pad, the lead portions, the semiconductor element, and the bonding wires; wherein the external terminals of the plurality of lead portions are arranged in an alternately staggered form such that the respective external terminals of a pair of lead portions adjacent to each other are alternatively located on an inside or an outside; wherein the plurality of lead portions each have an inside region located on the inside of the external terminal, outside region located on the outside of the external terminal, and an external terminal region having the external terminal formed on a rear surface of the external terminal region; wherein respective rear surfaces of the inside region and the outside region of the lead portion, bearing at least the external terminal on the inside, are formed such that the inside region and the outside region are thinner than the external terminal region; and wherein a maximum thickness of the outside region of the lead portion with the external terminal located on the inside is larger than a maximum thickness of the inside region of the lead portion with the external terminal located on the inside.

According to the present invention, the inside region in the semiconductor device of the lead portion with the external terminal located on the inside has a flat rear surface, and has a substantially quadrilateral shape in a cross section orthogonal to a longitudinal direction of the lead portion.

According to the present invention, the outside region in the semiconductor device of the lead portion with the external terminal located on the inside has a convexed portion projecting downward in a cross section orthogonal to a longitudinal direction of the lead portion with the external terminal located on the inside.

According to the present invention, the outside region in the semiconductor device of the lead portion with the external terminal located on the inside has a substantially pentagonal shape in the cross section orthogonal to the longitudinal direction of the lead portion with the external terminal located on the inside.

According to the present invention, the external terminals in the semiconductor device of the plurality of lead portions each have a larger width than a top surface of the external terminal region.

According to the present invention, there is provided a method of manufacturing a lead frame, the lead frame including a die pad on which a semiconductor element is to be mounted and a plurality of lead portions provided on a periphery of the die pad, the plurality of lead portions each including an internal terminal and an external terminal, the external terminals of the plurality of lead portions being arranged in an alternately staggered form such that the respective external terminals of a pair of lead portions adjacent to each other are alternatively located on an inside or an outside, the plurality of lead portions each having an inside region located on the inside of the external terminal, an outside region located on the outside of the external terminal, and an external terminal region having the external terminal formed on a rear surface of the external terminal region, the method including: preparing a metal substrate; and forming the die pad and the lead portions in the metal substrate by etching the metal substrate; wherein when the die pad and the lead portions are formed in the metal substrate, respective rear surfaces of the inside region and the outside region of the lead portion, bearing at least the external terminal on the inside, are formed such that the inside region and the outside region are thinner than the external terminal region; and wherein a maximum thickness of the outside region of the lead portion with the external terminal located on the inside is larger than a maximum thickness of the inside region of the lead portion with the external terminal located on the inside.

According to the present invention, there is provided a method of manufacturing a semiconductor device, the method including: manufacturing a lead frame by means of the method of manufacturing the lead frame; mounting a semiconductor element on the die pad of the lead frame; electrically connecting the semiconductor element to the internal terminals of the lead portions by bonding wires; and sealing the die pad, the lead portions, the semiconductor element, and the bonding wires with a sealing resin.

According to the present invention, the maximum thickness of the outside region of the lead portion is larger than the maximum thickness of the inside region of the lead portion. Thus, a decrease in the strength of the lead portions is suppressed, and the lead portions can be prevented from being deformed, even when the width of the lead portions is narrower.

According to the present invention, there is provided a lead frame including: a die pad on which a semiconductor element is to be mounted; and a plurality of lead portions provided on a periphery of the die pad, the plurality of lead portions each including an external terminal located at an inner end of the lead portion; wherein the external terminals of the plurality of lead portions are arranged in an alternately staggered form such that the respective external terminals of a pair of lead portions adjacent to each other are alternatively located on an inside or an outside; wherein the plurality of lead portions each have an outside region located on the outside of the external terminal and an external terminal region having the external terminal formed on a rear surface of the external terminal region; and wherein a rear surface of the outside region of the lead portion, bearing at least the external terminal on the inside, is formed such that the outside region is thinner than the external terminal region, and the outside region has a convexed portion projecting in a direction of the rear surface or a recessed portion recessed in a direction of a top surface in a cross section orthogonal to a longitudinal direction of the lead portion with the external terminal located on the inside.

According to the present invention, in the lead frame, the outside region of the lead portion with the external terminal located on the inside has a substantially pentagonal shape in the cross section orthogonal to the longitudinal direction of the lead portion with the external terminal located on the inside.

According to the present invention, in the lead frame, the outside region of the lead portion with the external terminal located on the inside has a substantially concave shape in the cross section orthogonal to the longitudinal direction of the lead portion with the external terminal located on the inside.

According to the present invention, in the lead frame, the external terminals of the plurality of lead portions each have a larger width than a top surface of the external terminal region.

According to the present invention, there is provided a semiconductor device including: a die pad; a plurality of lead portions provided on a periphery of the die pad, the plurality of lead portions each including an external terminal located at an inner end of the lead portion; a semiconductor element mounted on the die pad; bonding wires for electrically connecting the semiconductor element to the lead portions; and a sealing resin for sealing the die pad, the lead portions, the semiconductor element, and the bonding wires; wherein the external terminals of the plurality of lead portions are arranged in an alternately staggered form such that the respective external terminals of a pair of lead portions adjacent to each other are alternatively located on an inside or an outside; wherein the plurality of lead portions each have an outside region located on the outside of the external terminal and an external terminal region having the external terminal formed on a rear surface of the external terminal region; and wherein a rear surface of the outside region of the lead portion, bearing at least the external terminal on the inside, is formed such that the outside region is thinner than the external terminal region, and the outside region has a convexed portion projecting in a direction of the rear surface or a recessed portion recessed in a direction of a top surface in a cross section orthogonal to a longitudinal direction of the lead portion with the external terminal located on the inside.

According to the present invention, in the semiconductor device, the outside region of the lead portion with the external terminal located on the inside has a substantially pentagonal shape in the cross section orthogonal to the longitudinal direction of the lead portion with the external terminal located on the inside.

According to the present invention, in the semiconductor device, the outside region of the lead portion with the external terminal located on the inside has a substantially concave shape.

According to the present invention, in the semiconductor device, the external terminals of the plurality of lead portions each have a larger width than a top surface of the external terminal region.

According to the present invention, there is provided a method of manufacturing a lead frame, the lead frame including a die pad on which a semiconductor element is to be mounted, and a plurality of lead portions provided on a periphery of the die pad, the plurality of lead portions each including an external terminal located at an inner end of the lead portion, the external terminals of the plurality of lead portions being arranged in an alternately staggered form such that the respective external terminals of a pair of lead portions adjacent to each other are alternatively located on an inside or an outside, the plurality of lead portions each having an outside region located on the outside of the external terminal and an external terminal region having the external terminal formed on a rear surface of the external terminal region, the method including: preparing a metal substrate; and forming the die pad and the lead portions in the metal substrate by etching the metal substrate; wherein when the die pad and the lead portions are formed in the metal substrate, a rear surface of the outside region of the lead portion, bearing at least the external terminal on the inside, is formed such that the outside region is thinner than the external terminal region, and a convexed portion projecting in a direction of the rear surface or a recessed portion recessed in a direction of a top surface in a cross section orthogonal to a longitudinal direction of the lead portion with the external terminal located on the inside is formed in the outside region of the lead portion with the external terminal located on the inside.

According to the present invention, there is provided a method of manufacturing a semiconductor device, the method including: manufacturing a lead frame by means of the method of manufacturing the lead frame; mounting a semiconductor element on the die pad of the lead frame; electrically connecting the semiconductor element to internal terminals of the lead portions by bonding wires; and sealing the die pad, the lead portions, the semiconductor element, and the bonding wires with a sealing resin.

According to the present invention, the outside region of the lead portion has the convexed portion projecting in the direction of the rear surface or the recessed portion recessed in the direction of the top surface in the cross section orthogonal to the longitudinal direction of the lead portion. Thus, a decrease in the strength of the lead portions is suppressed, and the lead portions can be prevented from being deformed, even when the width of the lead portions is narrower.

According to the present invention, there is provided a lead frame for a semiconductor device, the lead frame including: a rectangular die pad on which a semiconductor element is to be mounted; and a plurality of lead portions provided on a periphery of the die pad; wherein the plurality of lead portions are arranged along a side of the die pad, and a pair of lead portions adjacent to each other is coupled to each other through a coupling body located within a region corresponding to the semiconductor device, the pair of lead portions being arranged in a vicinity of an end portion of the side of the die pad.

According to the present invention, in the lead frame, a rear surface of the coupling body is formed by means of half etching such that the coupling body has a small thickness.

According to the present invention, in the lead frame, rear surfaces of the pair of lead portions are each provided with an external terminal, and the external terminals of the pair of lead portions have planar shapes identical to each other.

According to the present invention, there is provided a lead frame for a semiconductor device, the lead frame including: a rectangular die pad on which a semiconductor element is to be mounted; and a plurality of long lead portions and a plurality of short lead portions provided on a periphery of the die pad; wherein the plurality of long lead portions and the plurality of short lead portions are arranged along a side of the die pad; wherein a pair of short lead portions is arranged so as to be adjacent to each other in a vicinity of an end portion of the side of the die pad; and wherein the pair of short lead portions is coupled to each other through a coupling body located within a region corresponding to the semiconductor device.

According to the present invention, in the lead frame, a rear surface of the coupling body is formed by means of half etching such that the coupling body has a small thickness.

According to the present invention, in the lead frame, rear surfaces of the pair of short lead portions are each provided with an external terminal, and the external terminals of the pair of short lead portions have planar shapes identical to each other.

According to the present invention, in the lead frame, at least one of the plurality of short lead portions has a smaller width on a top surface side than a width on a rear surface side.

According to the present invention, supposing that a number of the plurality of long lead portions arranged along the side of the die pad is n in the lead frame, a number of the plurality of short lead portions arranged along the side of the die pad is n+3.

According to the present invention, there is provided a semiconductor device including: a rectangular die pad; a plurality of lead portions provided on a periphery of the die pad; a semiconductor element mounted on the die pad; connection portions for electrically connecting the semiconductor element to the lead portions; and a sealing resin portion for sealing the die pad, the lead portions, the semiconductor element, and the connection portions; wherein the plurality of lead portions are arranged along a side of the die pad; and wherein a pair of lead portions adjacent to each other is coupled to each other through a coupling body, the pair of lead portions being arranged in a vicinity of an end portion of the side of the die pad.

According to the present invention, there is provided a semiconductor device including: a rectangular die pad; a plurality of long lead portions and a plurality of short lead portions provided on a periphery of the die pad; a semiconductor element mounted on the die pad; connection portions for electrically connecting the semiconductor element to the plurality of long lead portions or the plurality of short lead portions; and a sealing resin portion for sealing the die pad, the plurality of long lead portions, the plurality of short lead portions, the semiconductor element, and the connection portions; wherein the plurality of long lead portions and the plurality of short lead portions are arranged along a side of the die pad; wherein a pair of short lead portions is arranged so as to be adjacent to each other in a vicinity of an end portion of the side of the die pad; and wherein the pair of short lead portions is coupled to each other through a coupling body.

According to the present invention, there is provided a method of manufacturing a lead frame, the method including: preparing a metal substrate; forming etching resist layers on a top surface and a rear surface of the metal substrate; forming a rectangular die pad on which a semiconductor element is to be mounted and a plurality of lead portions provided on a periphery of the die pad in the metal substrate through etching the top surface and the rear surface of the metal substrate with the use of the etching resist layers as corrosion-resistant films; and removing the etching resist layers from the top surface and the rear surface of the metal substrate; wherein the plurality of lead portions are arranged along a side of the die pad; and wherein a pair of lead portions adjacent to each other is coupled to each other through a coupling body located within a region corresponding to a semiconductor device, the pair of lead portions being arranged in a vicinity of an end portion of the side of the die pad.

According to the present invention, there is provided a method of manufacturing a lead frame, the method including: preparing a metal substrate; forming etching resist layers on a top surface and a rear surface of the metal substrate; forming a rectangular die pad on which a semiconductor element is to be mounted and a plurality of long lead portions and a plurality of short lead portions provided on a periphery of the die pad in the metal substrate through etching the top surface and the rear surface of the metal substrate with the use of the etching resist layers as corrosion-resistant films; and removing the etching resist layers from the top surface and the rear surface of the metal substrate; wherein the plurality of long lead portions and the plurality of short lead portions are arranged along a side of the die pad; wherein a pair of short lead portions is arranged so as to be adjacent to each other in a vicinity of an end portion of the side of the die pad; and wherein the pair of short lead portions is coupled to each other through a coupling body located within a region corresponding to a semiconductor device.

According to the present invention, there is provided a method of manufacturing a semiconductor device, the method including: manufacturing a lead frame by means of the method of manufacturing the lead frame; mounting the semiconductor element on the die pad of the lead frame; electrically connecting the semiconductor element to the lead portions of the lead frame through connection portions; and sealing the die pad, the lead portions, the semiconductor element, and the connection portions with a sealing resin portion.

According to the present invention, there is provided a method of manufacturing a semiconductor device, the method including: manufacturing a lead frame by means of the method of manufacturing the lead frame; mounting the semiconductor element on the die pad of the lead frame; electrically connecting the semiconductor element to the long lead portions or the short lead portions of the lead frame by connection portions; and sealing the die pad, the long lead portions, the short lead portions, the semiconductor element, and the connection portions with a sealing resin portion.

According to the present invention, there is provided a lead frame for a semiconductor device, the lead frame including: a die pad on which a semiconductor element is to be mounted; and a plurality of lead portions provided on a periphery of the die pad; wherein a plurality of lead portions adjacent to each other, the plurality of lead portions being arranged in a vicinity of a corner portion of a region corresponding to the semiconductor device, are coupled to each other through a coupling body having a rear surface formed such that the coupling body has a small thickness.

According to the present invention, there is provided a lead frame for a semiconductor device, the lead frame including: a die pad on which a semiconductor element is to be mounted; and a plurality of long lead portions and a plurality of short lead portions provided on a periphery of the die pad; wherein a plurality of short lead portions are arranged so as to be adjacent to each other in a vicinity of a corner portion of a region corresponding to the semiconductor device; and wherein the plurality of short lead portions are coupled to each other through a coupling body having a rear surface formed such that the coupling body has a small thickness.

According to the present invention, a solder portion connecting an external terminal disposed at a position close to a corner portion of the die pad to an external mounting board can be prevented from being cracked due to effects of thermal expansion and contraction.

MODE FOR CARRYING OUT THE INVENTION (First Embodiment)

A first embodiment of the present invention will be described below with reference to FIGS. 1 to 9(e).

Structure of Lead Frame

Outlines of a lead frame according to the present embodiment will first be described with reference to FIGS. 1 to 3(c). FIGS. 1 to 3(c) are diagrams showing the lead frame according to the present embodiment.

Figure 1:
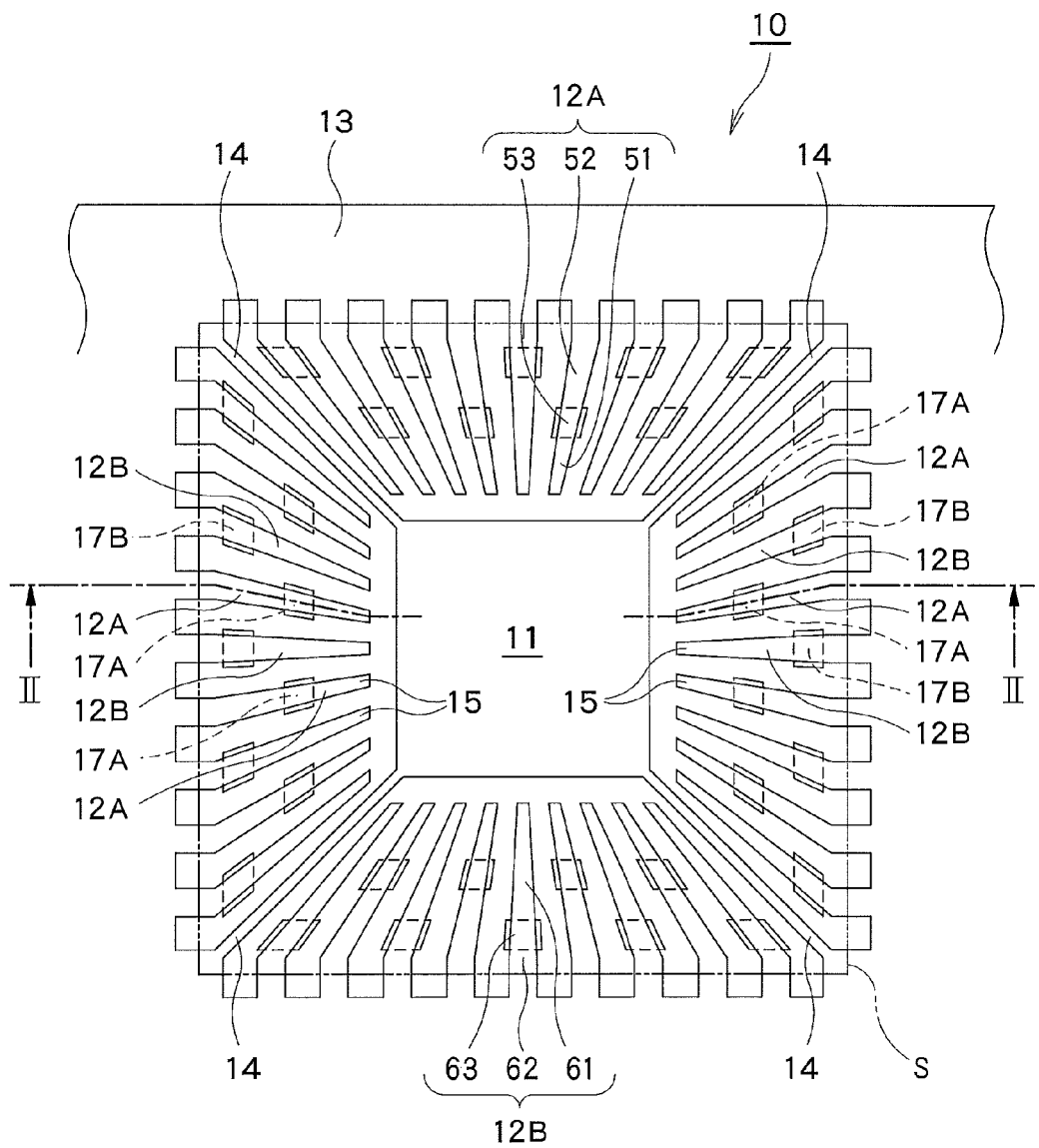
FIG. 1 is a plan view of a lead frame according to a first embodiment of the present invention.
Figure 2:
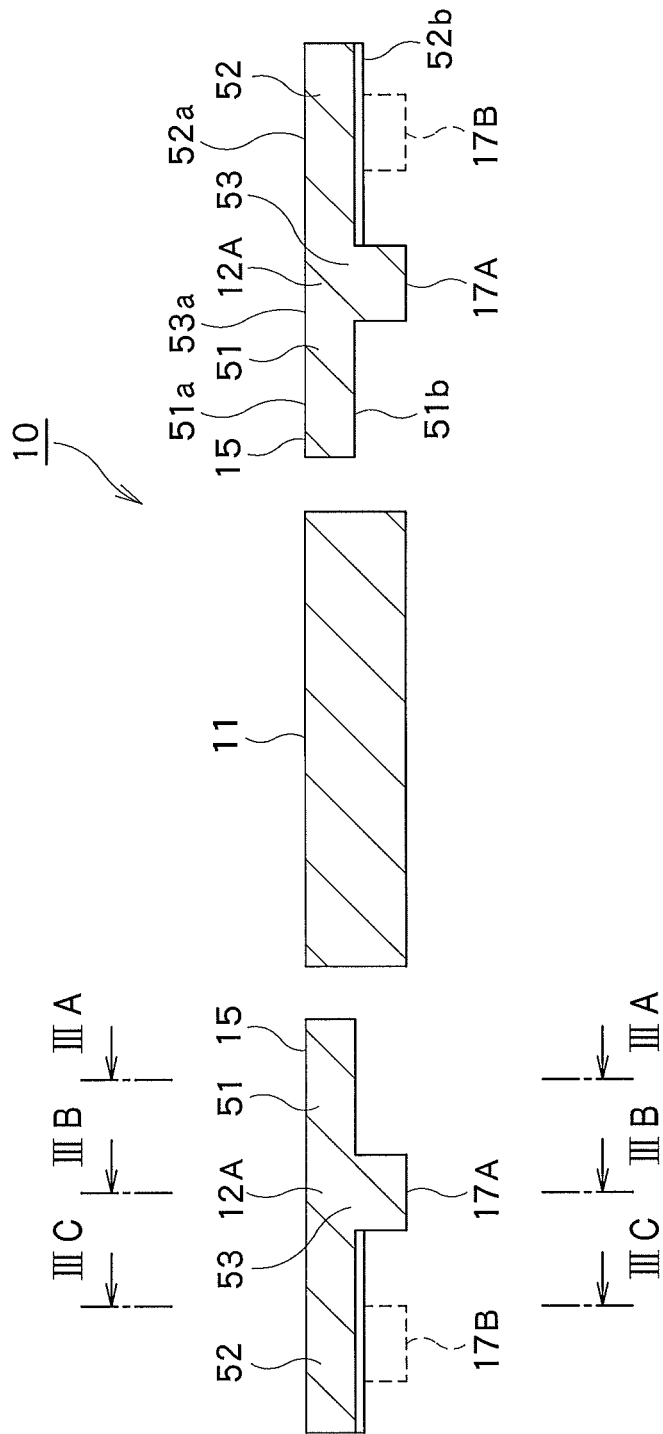
FIG. 2 is a sectional view of the lead frame according to the first embodiment of the present invention (sectional view taken along a line II-II of FIG. 1)
Figure 3:
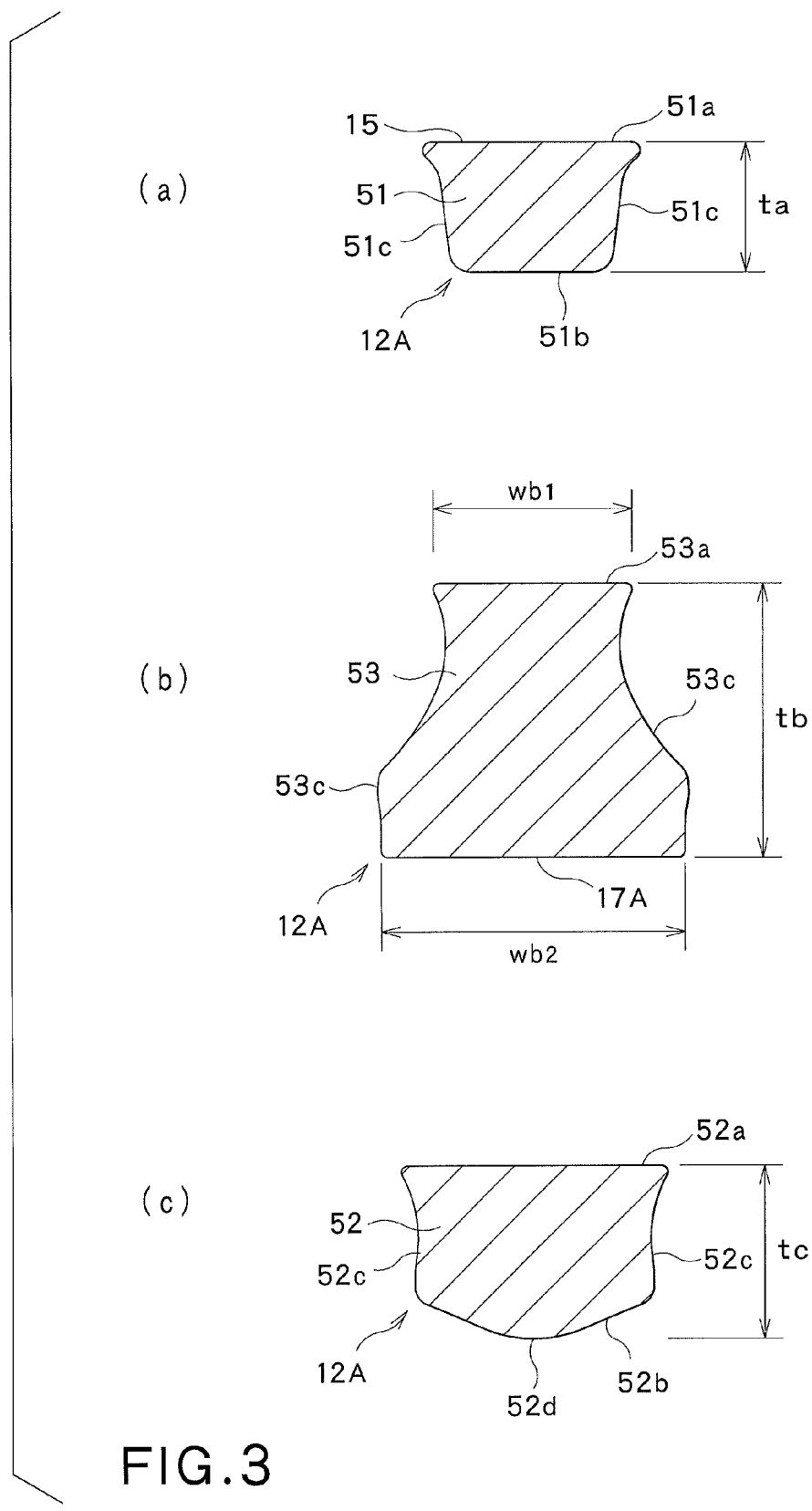
FIGS. 3(a) to 3(c) are sectional views of a lead portion having a first external terminal (the sectional views being a sectional view taken along a line IIIA-IIIA of FIG. 2, a sectional view taken along a line IIIB-IIIB of FIG. 2, and a sectional view taken along a line IIIC-IIIC of FIG. 2, respectively)

As shown in FIG. 1 and FIG. 2, the lead frame 10 includes a die pad 11 of a rectangular planar shape, on which a semiconductor element 21 (to be described later) is to be mounted, and a plurality of elongate lead portions 12A and 12B provided on the periphery of the die pad 11 to connect the semiconductor element 21 to an external circuit (not shown).

An outer frame 13 supporting the die pad 11 and the lead portions 12A and 12B is provided on the periphery of the lead portions 12A and 12B. Further, suspension leads 14 are coupled to four corners of the die pad 11 that is coupled to and supported by the outer frame 13 via the four suspension leads 14.

The lead portions 12A and 12B adjacent to each other are formed in such a shape as to be electrically insulated from each other after the manufacturing of a semiconductor device 20 (to be described later). In addition, the lead portions 12A and 12B are each formed in such a shape as to be electrically insulated from the die pad 11 after the manufacturing of the semiconductor device 20. Further, the lead portions 12A and 12B each have a rear surface exposed from the semiconductor device 20 to the outside. External terminals 17A and 17B (outer lead portions) each electrically connected to an external mounting board (not shown) are formed on the rear surfaces of the lead portions 12A and 12B.

In this case, the external terminals 17A and 17B of the plurality of lead portions 12A and 12B are arranged in an alternately staggered form such that the external terminals 17A and 17B of lead portions 12A and 12B adjacent to each other are located on the inside and the outside, respectively. That is, the lead portions 12A whose external terminals 17A are relatively located on the inside (die pad 11 side) and the lead portions 12B whose external terminals 17B are relatively located on the outside (outer frame 13 side) are alternately arranged over the entire periphery of the die pad 11. Incidentally, in the present specification, the external terminals 17A located on the inside will be referred to also as first external terminals 17A, and the external terminals 17B located on the outside will be referred to also as second external terminals 17B.

As shown in FIG. 1, the plurality of first external terminals 17A are each arranged along a straight line parallel to one side of the die pad 11 as viewed in plan. The plurality of second external terminals 17B are also each arranged on a straight line parallel to one side of the die pad 11 as viewed in plan. However, without being limited to this, the plurality of first external terminals 17A and/or the plurality of second external terminals 17B may each be arranged on an arc as viewed in plan, for example.

A lead portion 12A, out of the plurality of lead portions 12A and 12B, having a first external terminal 17A includes an inside region 51, an outside region 52, and an external terminal region 53. The inside region 51 among these regions is located on the inside of the first external terminal 17A (die pad 11 side), and an internal terminal 15 (inner lead portion) is formed on a surface of an inside end portion of the inside region 51. The internal terminal 15 forms a region electrically connected to the semiconductor element 21 via a bonding wire 22, as will be described later. In addition, the outside region 52 is located on the outside of the first external terminal 17A (outer frame 13 side), and an outer end portion of the outside region 52 is coupled to the outer frame 13. Further, the first external terminal 17A is formed on the rear surface of the external terminal region 53.

In this case, the inside region 51 and the outside region 52 of the lead portion 12A are each formed thin by means of half etching. On the contrary, the external terminal region 53 is not subjected to the half etching, but has a same thickness as the die pad 11 and the outer frame 13. Incidentally, the half etching refers to etching a material to be etched partway in a direction of thickness of the material to be etched (partial etching).

Of the plurality of lead portions 12A and 12B, a lead portion 12B having a second external terminal 17B includes an inside region 61, an outside region 62, and an external terminal region 63. The inside region 61 among these regions is located on the inside of the second external terminal 17B (die pad 11 side), and an internal terminal 15 (inner lead portion) is formed on a surface of an inside end portion of the inside region 61. The outside region 62 is located on the outside of the second external terminal 1713 (outer frame 13 side), and an outside end portion of the outside region 62 is coupled to the outer frame 13. Further, the second external terminal 17B is formed on the rear surface of the external terminal region 63.

In this case, the inside region 61 and the outside region 62 of the lead portion 12B are each formed thin by means of the half etching. On the contrary, the external terminal region 63 is not subjected to the half etching, but has a same thickness as the die pad 11 and the outer frame 13.

The cross-sectional shape of the lead portions 12A having the first external terminals 17A among the plurality of lead portions 12A and 12B will now be described with reference to FIGS. 3(a) to 3(c). FIGS. 3(a) to 3(c) are each a diagram showing the cross-sectional shape of a lead portion 12A in a direction orthogonal to the longitudinal direction of the lead portion 12A. FIG. 3(a) of the figures is a sectional view of the inside region 51 in the lead portion 12A (sectional view taken along a line IIIA-IIIA of FIG. 2). FIG. 3(b) is a sectional view of the external terminal region 53 in the lead portion 12A (sectional view taken along a line IIIB-IIIB of FIG. 2). FIG. 3(c) is a sectional view of the outside region 52 in the lead portion 12A (sectional view taken along a line IIIC-IIIC of FIG. 2).

As shown in FIG. 3(a), the inside region 51 of the lead portion 12A has a top surface 51a having the internal terminal 15, a flat rear surface 51b formed by means of the half etching, and a pair of side surfaces 51c. The inside region 51 has a cross section of a substantially quadrilateral (substantially trapezoidal) shape. The substantially quadrilateral (substantially trapezoidal) shape here is not limited to a quadrilateral (trapezoidal) shape in a strict sense, but also includes shapes in which the pair of side surfaces 51c is curved toward the inside in a width direction as shown in FIG. 3(a).

Because the inside region 51 of the lead portion 12A thus has the flat rear surface 51b, the rear surface 51b of the inside region 51 can be mounted on a heat block 36 stably in a wire bonding process, which will be described later. This enables bonding wires 22 to be connected to the internal terminals 15 stably, such that the wire bonding work will be more reliable.

The thickness $t_a$ of the inside region 51 is preferably 10% to 50% of the thickness $t_b$ of the external terminal region 53 (FIG. 3(b)). The thickness $t_a$ of the inside region 51 here refers to a maximum thickness in the cross section of the inside region 51.

As shown in FIG. 3(b), the external terminal region 53 of the lead portion 12A has a top surface 53a, the first external terminal 17A formed on the rear surface, and a pair of side surfaces 53c partly curved to the inside.

In this case, the width $w_{b2}$ of the first external terminal 17A (rear surface of the external terminal region 53) is larger than the width $w_{b1}$ of the top surface of the external terminal region 53. A wide area of the first external terminal 17A can be thereby secured even when intervals between the lead portions 12A and the lead portions 12B adjacent to each other are narrower. The first external terminal 17A and the external mounting board (not shown) can be reliably connected to each other as a result.

As shown in FIG. 3(c), the outside region 52 of the lead portion 12A has a top surface 52a, a rear surface 52b in which a convexed portion 52d projecting downward is formed by means of the half etching, and a pair of side surfaces 52c. The outside region 52 has a cross section of a substantially pentagonal shape. The substantially pentagonal shape here is not limited to a pentagonal shape in a strict sense, but includes shapes in which the pair of side surfaces 52c is partly curved toward the inside in the width direction, as shown in FIG. 3(c).

In this case, one convexed portion 52d is formed at substantially a central portion in the width direction of the outside region 52 (horizontal direction of FIG. 3(c)) in the cross section of the outside region 52. However, without limitation to this, a plurality of convexed portions 52d may be formed in the width direction of the outside region 52 by means of half etching, for example.

The geometrical moment of inertia of the outside region 52 increases, and the strength of the outside region 52 serving as a base part of the lead portion 12A can be enhanced since the outside region 52 of the lead portion 12A thus has a cross section of a substantially pentagonal shape. These advantages prevent the lead portion 12A from being deformed while the semiconductor device 20 (to be described later) is being manufactured, thereby deterring problems such as a displacement of the first external terminal 17A and difficulty in wire bonding work.

The thickness $t_c$ of the outside region 52 is larger than the thickness $t_a$ of the inside region 51 (FIG. 3(a)) ($t_c > t_a$). The thickness $t_c$ of the outside region 52 may be 50% to 90% of the thickness $t_b$ of the external terminal region 53 (FIG. 3(b)), for example. Here, the thickness $t_c$ of the outside region 52 refers to a maximum thickness in the cross section of the outside region 52 (the thickness measured at the area where the convexed portion 52d is disposed in this case).

The outside region 52 serving as the base part of the lead portion 12A is unlikely to be deformed because the thickness $t_c$ of the outside region 52 of the lead portion 12A is larger than the thickness $t_a$ of the inside region 51. This prevents the lead portion 12A from being deformed while the semiconductor device 20 (to be described later) is being manufactured, thereby deterring problems such as a displacement of the first external terminal 17A and difficulty in wire bonding work.

The cross-sectional shapes of the inside region 61 and the external terminal region 63 of the lead portion 12B having the second external terminal 17B are substantially similar to the cross-sectional shapes of the inside region 51 and the external terminal region 53, respectively, of the lead portion 12A described above. On the contrary, the cross-sectional shape of the outside region 62 of the lead portion 12B is different from the cross-sectional shape of the outside region 52 of the lead portion 12A, and is a substantially quadrilateral shape (shape similar to that of the inside region 51 shown in FIG. 3(a)). This is because the length of the outside region 62 of the lead portion 12B is relatively shorter than the length of the outside region 52 of the lead portion 12A and there is thus relatively less fear the outside region 62 be deformed. Without being limited to this, however, the outside region 62 of the lead portion 12B may have a cross section of a substantially pentagonal shape as with the outside region 52 of the lead portion 12A.

The above-described lead frame 10 overall includes a metal such as copper, a copper alloy, and a 42 alloy (Fe alloy containing 42% Ni). The thickness of the lead frame 10, although depending on the structure of the semiconductor device 20 to be manufactured, can be 0.10 mm to 0.30 mm.

Although FIG. 1 shows only one die pad 11 for convenience's sake, a plurality of die pads 11 are manufactured while being imposed to one lead frame 10 in actuality. In addition, a region S (phantom line) in FIG. 1 represents a region corresponding to one semiconductor device 20 in the lead frame 10.

A total of 36 lead portions 12A and 12B are provided in FIG. 1. However, without limitation to this, the total number of lead portions 12A and 12B may be 80 to 200, for example. The pitch of the lead portions 12A and 12B adjacent to each other may be 0.15 mm to 0.40 mm. Further, the lead portions 12A and 12B in FIG. 1 are arranged along the four sides of the die pad 11. However, without being limited to this, the lead portions 12A and 12B may be arranged along only two sides of the die pad 11 which sides are opposed to each other, for example.

Structure of Semiconductor Device

Figure 4:
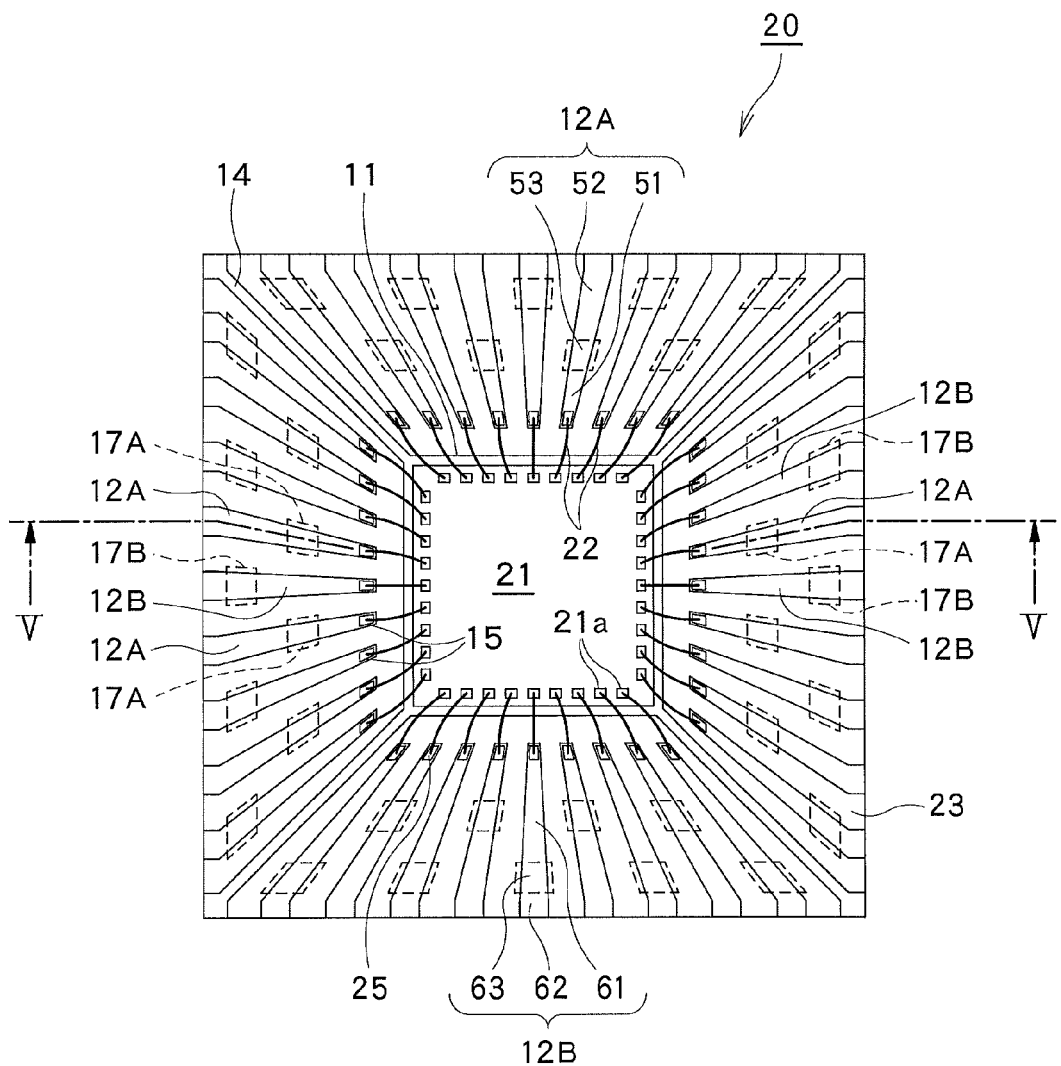
FIG. 4 is a plan view of a semiconductor device according to the first embodiment of the present invention.
Figure 5:
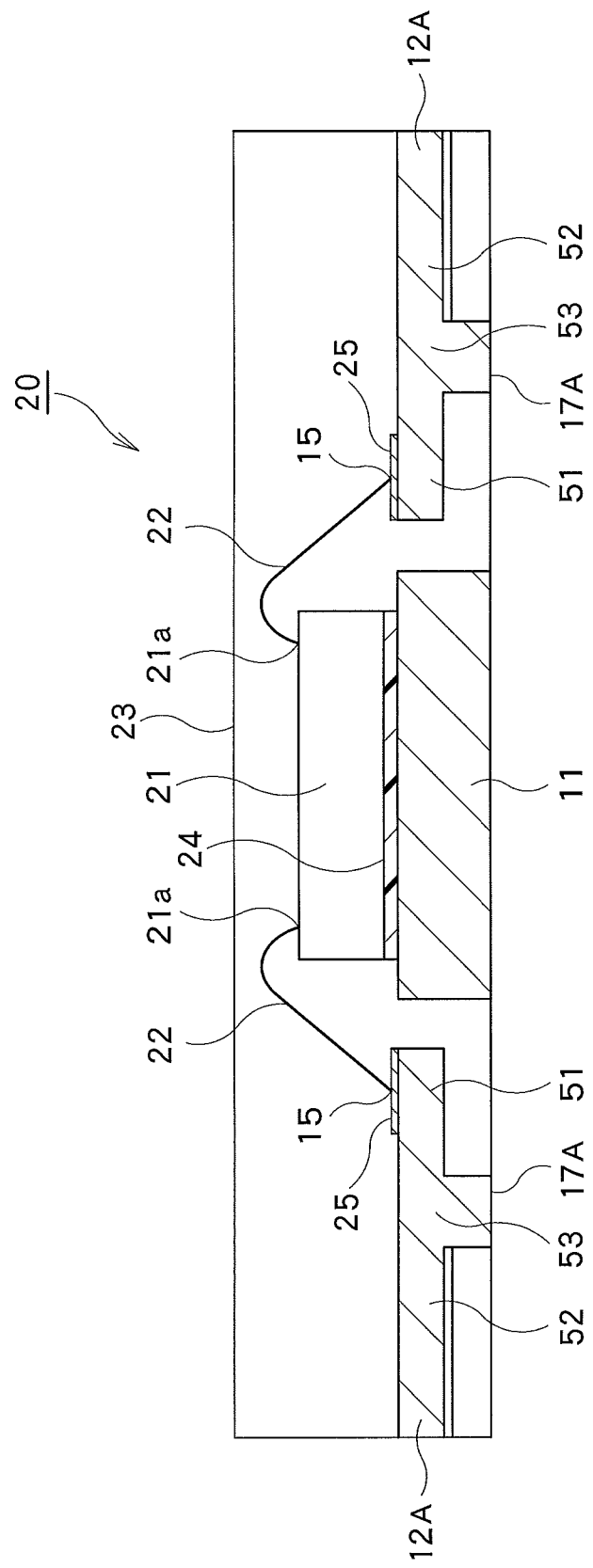
FIG. 5 is a sectional view of the semiconductor device according to the first embodiment of the present invention (sectional view taken along a line V-V of FIG. 4)
Figure 6:
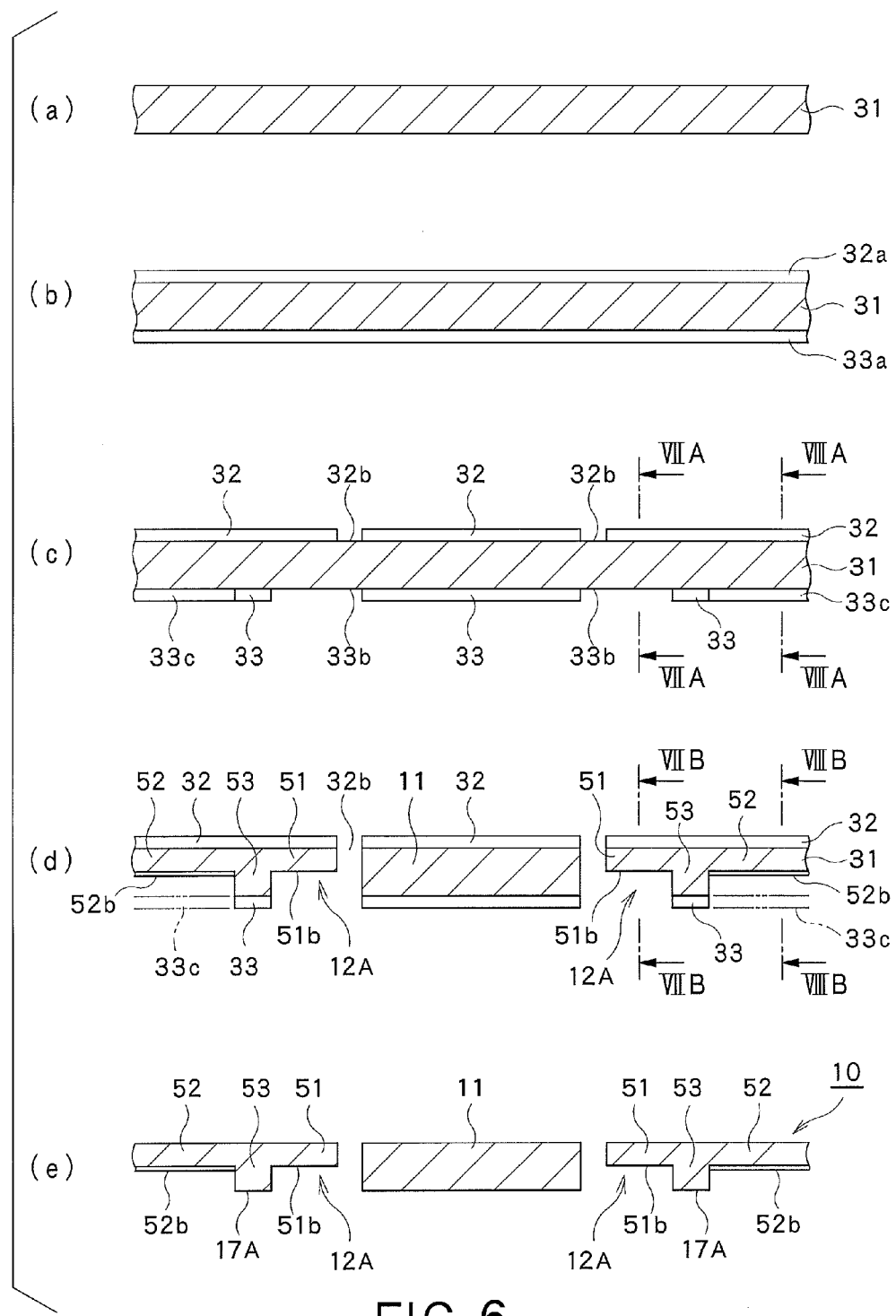
FIGS. 6(a) to 6(e) are sectional views showing a method of manufacturing the lead frame according to the first embodiment of the present invention.
Figure 7:
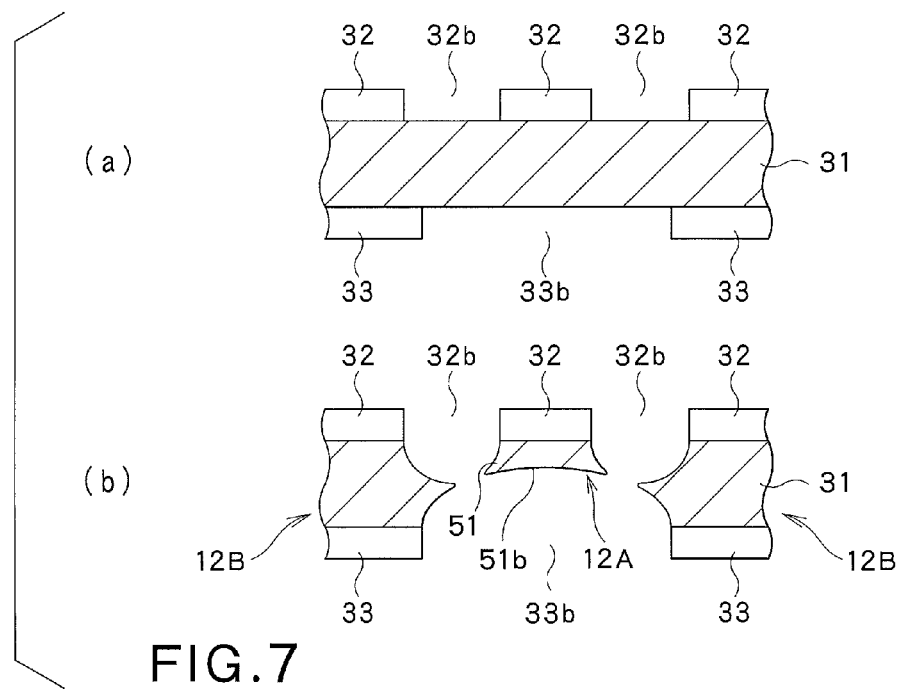
FIGS. 7(a) and 7(b) are sectional views of an inside region of a lead portion in a lead frame manufacturing process (the sectional views being a sectional view taken along a line VIIA-VIIA of FIG. 6(c) and a sectional view taken along a line VIIB-VIIB of FIG. 6(d), respectively)
Figure 8:
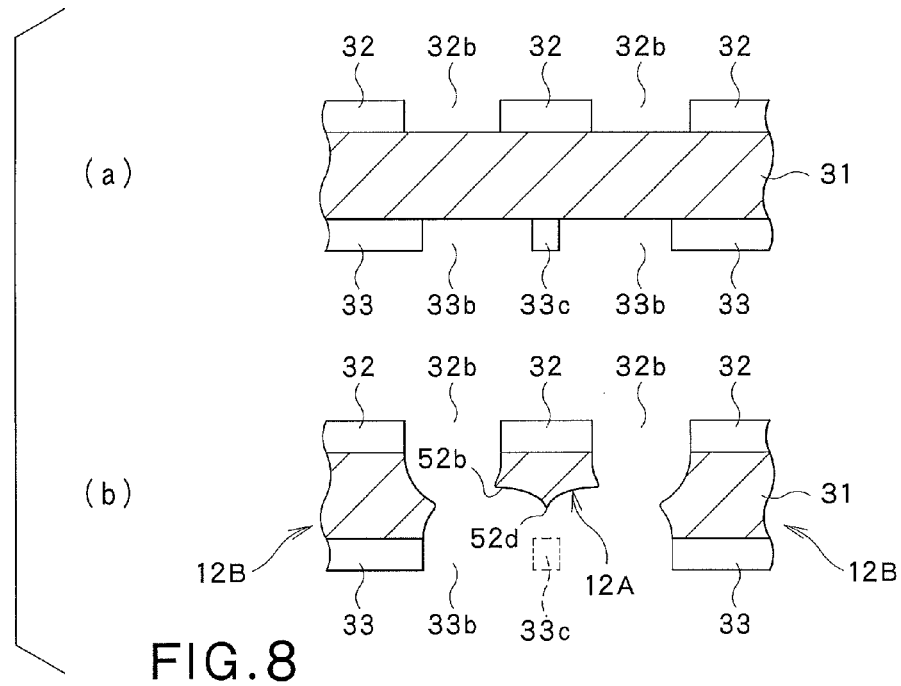
FIGS. 8(a) and 8(b) are sectional views showing an outside region of the lead portion in the lead frame manufacturing process (the sectional views being a sectional view taken along a line VIIIA-VIIIA of FIG. 6(c) and a sectional view taken along a line VIIIB-VIIIB of FIG. 6(d), respectively)
Figure 9:
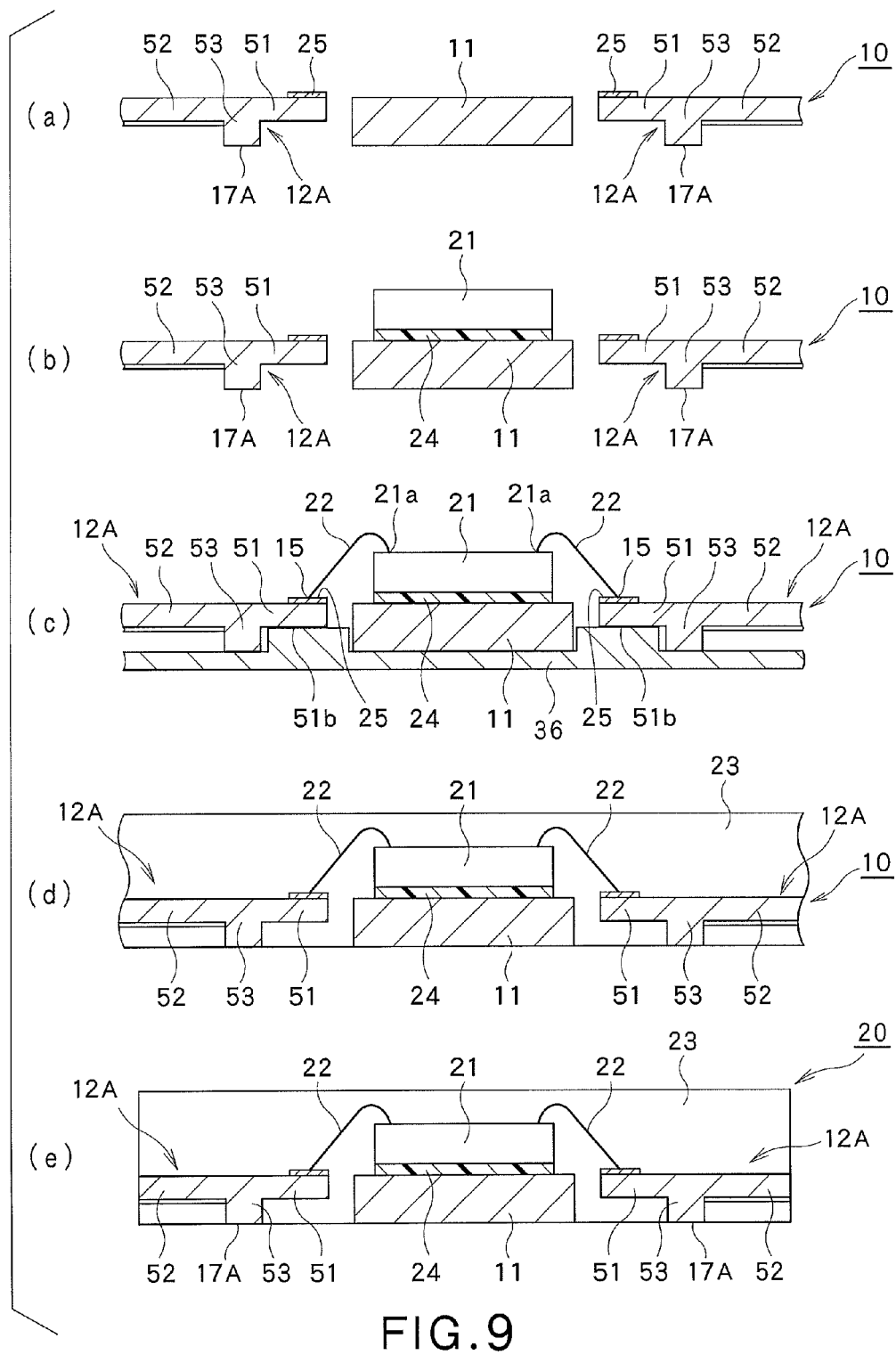
FIGS. 9(a) to 9(e) are sectional views showing a method of manufacturing the semiconductor device according to the first embodiment of the present invention.

A semiconductor device according to the present embodiment will now be described with reference to FIG. 4 and FIG. 5. FIG. 4 and FIG. 5 are diagrams showing the semiconductor device according to the present embodiment {DR-QFN (Dual Row QFN) type}.

As shown in FIG. 4 and FIG. 5, the semiconductor device (semiconductor package) 20 includes: a die pad 11; a plurality of lead portions 12A and 12B arranged on the periphery of the die pad 11; a semiconductor element 21 mounted on the die pad 11; and a plurality of bonding wires (connection portions) 22 for electrically connecting the lead portions 12A and 12B to the semiconductor element 21. In addition, the die pad 11, the lead portions 12A and 12B, the semiconductor element 21, and the bonding wires 22 are resin-sealed with a sealing resin 23.

The die pad 11 and the lead portions 12A and 12B of these structural elements are fabricated from the above-described lead frame 10. The structure of the die pad and the lead portions 12A and 12B is similar to the above-described structure shown in FIGS. 1 to 3(c), and detailed description thereof will be omitted here.

Various kinds of semiconductor elements conventionally commonly used can be employed as the semiconductor element 21. For example, an integrated circuit, a large-scale integrated circuit, a transistor, a thyristor, or a diode, can be used as the semiconductor element 21 but not limited to them. The semiconductor element 21 has a plurality of terminal portions 21a to which the respective bonding wires 22 are attached. In addition, the semiconductor element 21 is fixed to the top surface of the die pad 11 by means of for example an adhesive 24 such as a die bonding paste.

Each of the bonding wires 22 is formed of, for example, a material having high electric conductivity such as gold. The bonding wire 22 has one end connected to the terminal portions 21a of the semiconductor element 21 and the other end connected to the internal terminals 15 of the lead portions 12A and 12B. The internal terminals 15 are provided with a plating portion 25 for improving adhesion to the bonding wires 22.

A thermosetting resin such as a silicone resin and an epoxy resin, or a thermoplastic resin such as a PPS resin can be used as the sealing resin 23. The overall thickness of the sealing resin 23 can be approximately 500 μm to 1000 μm. Incidentally, FIG. 4 does not show the sealing resin 23 located on the top surface side of the die pad 11 and the lead portions 12A and 12B.

Method of Manufacturing Lead Frame

A method of manufacturing the lead frame 10 shown in FIGS. 1 to 3(c) will now be described with reference to FIGS. 6(a) to 6(e), FIGS. 7(a) and 7(b), and FIGS. 8(a) and 8(b). FIGS. 6(a) to 6(e) are sectional views showing the method of manufacturing the lead frame 10 (views corresponding to FIG. 2). FIGS. 7(a) and 7(b) are sectional views of the inside region 51 in the lead portion 12A. FIGS. 7(a) and 7(b) show a section taken along a line VIIA-VIIA of FIG. 6(c) and a section taken along a line VIIB-VIIB of FIG. 6(d), respectively. FIGS. 8(a) and 8(b) are sectional views of the outside region 52 in the lead portion 12A. FIGS. 8(a) and 8(b) show a section taken along a line VIIIA-VIIIA of FIG. 6(c) and a section taken along a line VIIIB-VIIIB of FIG. 6(d), respectively.

As shown in FIG. 6(a), a flat metal substrate 31 is prepared first. A substrate formed of a metal such as copper, a copper alloy, and a 42 alloy (Fe alloy containing 42% Ni) can be used as the metal substrate 31. A substrate both surfaces of which have been degreased, for example, and cleaned is preferably used as the metal substrate 31.

Next, the entire top surface and entire rear surface of the metal substrate 31 are coated with photosensitive resists 32a and 33a, respectively. The photosensitive resists 32a and 33a are then dried (FIG. 6(b)). Conventionally publicly known photosensitive resists can be used as the photosensitive resists 32a and 33a.

Subsequently, the metal substrate 31 is exposed to light via a photomask and developed, whereby etching resist layers 32 and 33 having desired opening portions 32b and 33b are formed (FIG. 6(c)).

At this time, an opening portion 33b is provided in advance at a position corresponding to the inside region 51 of the lead portion 12A in the etching resist layer 33 formed on the rear surface side of the metal substrate 31 (FIG. 6(c) and FIG. 7(a)). Meanwhile, a partial resist 33c is provided in advance at a position corresponding to the outside region 52 of the lead portion 12A in the etching resist layer 33 along the longitudinal direction of the outside region 52 (FIG. 6(c) and FIG. 8(a)).

Next, the metal substrate 31 is etched by use of an etchant with the etching resist layers 32 and 33 used as corrosion-resistant films (FIG. 6(d)). The external shapes of the die pad 11 and the plurality of lead portions 12A and 12B are thereby formed. An appropriate etchant can be selected according to a material used for the metal substrate 31. For example, when copper is used as the metal substrate 31, a ferric chloride aqueous solution is normally used, and spray etching can be performed from both surfaces of the metal substrate 31.

As described above, the opening portion 33b is provided at the position corresponding to the inside region 51 of the lead portion 12A on the rear surface side of the metal substrate 31 (FIG. 7(a)). The rear surface of the metal substrate 31 is thereby half-etched when the metal substrate 31 is etched with an etchant, A flat rear surface 51b is formed (FIG. 7(b)) as a result. The cross-sectional shape of the inside region 51 becomes a substantially quadrilateral (substantially trapezoidal) shape accordingly.

Further, the partial resist 33c is provided at the position corresponding to the outside region 52 of the lead portion 12A on the rear surface side of the metal substrate 31 (FIG. 8(a)). When the metal substrate 31 is etched with an etchant, the etchant goes around from both sides of the partial resist 33c, the rear surface of the metal substrate 31 is half-etched, and a rear surface 52b having a convexed portion 52d is formed (FIG. 8(b)) thereby. The partial resist 33c is removed in the middle of the etching as the metal substrate 31 is corroded.

The cross-sectional shape of the outside region 52 thus becomes a substantially pentagonal shape. The thickness $t_c$ of the outside region 52 is larger than the thickness $t_a$ of the inside region 51.

Although not shown, the lead portions 12B having the second external terminals 17B are also formed at the same time when the metal substrate 31 is etched. The cross-sectional shapes of the inside regions 61 and the outside regions 62 of the lead portions 12B are each a substantially quadrilateral shape.

The etching resist layers 32 and 33 are thereafter peeled off and removed, whereby the lead frame 10 shown in FIGS. 1 to 3(c) is obtained (FIG. 6(e)).

Method of Manufacturing Semiconductor Device

A method of manufacturing the semiconductor device 20 shown in FIG. 4 and FIG. 5 will now be described with reference to FIGS. 9(a) to 9(e).

First, a lead frame 10 is fabricated with the method shown in FIGS. 6(a) to 6(e), FIGS. 7(a) and 7(b), and FIGS. 8(a) and 8(b).

Next, in order to improve adhesion between bonding wires 22 and internal terminals 15, the internal terminals 15 are plated to form plated portions 25 (FIG. 9(a)). In this case, a selected plating species may be any kind as long as the adhesion to the bonding wires 22 can be ensured. For example, the plating may be a single-layer plating of Ag or Au, or may be a multiple-layer plating formed by laminating Ni and Pd or Ni, Pd, and Au in this order. In addition, the plated portions 25 may be applied onto only connection portions of the internal terminals 15 connected to the bonding wires 22, or may be applied over the entire surface of the lead frame 10.

Next, a semiconductor element 21 is mounted on the die pad 11 of the lead frame 10. In this case, the semiconductor element 21 is mounted and fixed on the die pad 11 by use of for example an adhesive 24 such as a die bonding paste (die attaching process) (FIG. 9(b)).

Next, the terminal portions 21a of the semiconductor element 21 are electrically connected to the internal terminals 15 (plated portions 25) of lead portions 12A and 12B through bonding wires 22 (wire bonding process) (FIG. 9(c)).

At this time, the lead frame 10 is mounted on a heat block 36 of a wire bonding device. Next, the heat block 36 simultaneously heats the inside regions 51 of the lead portions 12A and the inside regions 61 of the lead portions 12B from the rear surface side of the inside regions 51 of the lead portions 12A and the inside regions 61 of the lead portions 12B so that the surface temperature of the lead portions 12A and 12B becomes approximately 150 to 280° C., for example. Together with this heating, the terminal portions 21a of the semiconductor element 21 are electrically connected to the internal terminals 15 of the lead portions 12A and 1213 by use of the bonding wires 22 while an ultrasonic wave is applied via a capillary (not shown) of the wire bonding device.

The lead portions 12A and 12B can be mounted on the heat block 36 stably since the inside regions 51 of the lead portions 12A and the inside regions 61 of the lead portions 12B each have a flat rear surface in this case. The bonding wires 22 thereby can be connected to the internal terminals 15 stably.

Next, a sealing resin 23 is formed by means of injection molding or transfer molding of a thermosetting resin or a thermoplastic resin on the lead frame 10 (FIG. 9(d)). The lead frame 10, the semiconductor element 21, and the bonding wires 22 are thereby sealed.

Next, the lead frame 10 is separated into lead frame elements of respective semiconductor elements 21 by dicing the sealing resin 23 between the semiconductor elements 21. At this time, the lead frame 10 and the sealing resin 23 between the semiconductor elements 21 may be cut while a blade (not shown) composed of a diamond wheel, for example, is rotated.

The semiconductor device 20 shown in FIG. 4 and FIG. 5 is thus obtained (FIG. 9(e)).

As described above, according to the present embodiment, the maximum thickness $t_c$ of the outside region 52 of the lead portion 12A is larger than the maximum thickness $t_a$ of the inside region 51 of the lead portion 12A. Thereby, even when intervals between the lead portions 12A and the lead portions 12B adjacent to each other are shorter and the width of the lead portions 12A is narrower, it is possible to curb a decrease in the strength of the lead portions 12A and prevent the first external terminals 17A from being displaced due to deformation of the lead portions 12A. As a result, the yield of the lead frame 10 can be improved.

According to the present embodiment, the inside region 51 of the lead portion 12A has the flat rear surface 51b, and has a substantially quadrilateral shape in the cross section orthogonal to the longitudinal direction of the lead portion 12A. This enables the rear surface 51b of the inside region 51 to be mounted on the heat block 36 stably and thus enables the bonding wires 22 to be connected to the internal terminals 15 stably during the wire bonding process.

According to the present embodiment, the outside region 52 of the lead portion 12A has the convexed portion 52d projecting downward in the cross section orthogonal to the longitudinal direction of the lead portion 12A. The outside region 52 further has a substantially pentagonal shape in the cross section orthogonal to the longitudinal direction of the lead portion 12A. This shape can increase the geometrical moment of inertia of the outside region 52, and therefore strengthen the outside region 52 serving as the base part of the lead portion 12A. It is thereby possible to develop the strength of the lead portion 12A, and prevent the first external terminal 17A from being displaced due to deformation of the lead portion 12A. As a result, the yield of the lead frame 10 can be improved.

The lead portion 12A can be lengthened because of the increased strength of the lead portion 12A. Thus, the internal terminal 15 can be brought closer to the die pad 11. It is thereby possible to reduce an amount of usage of expensive bonding wires 22, and thus lower the manufacturing cost of the lead frame 10.

(Second Embodiment)

A second embodiment of the present invention will now be described with reference to FIGS. 10 to 17(e). The second embodiment shown in FIGS. 10 to 17(e) is different mainly in terms of the structure of lead portions 12A and 12B, and is substantially identical to the foregoing first embodiment in terms of other structures. In FIGS. 10 to 17(e), the same parts as in the first embodiment are identified by the same reference numerals, and detailed description thereof will be omitted.

Structure of Lead Frame

An overview of a lead frame according to the present embodiment will first be described with reference to FIGS. 10 to 12(b). FIGS. 10 to 12(b) are diagrams showing the lead frame according to the present embodiment.

Figure 10:
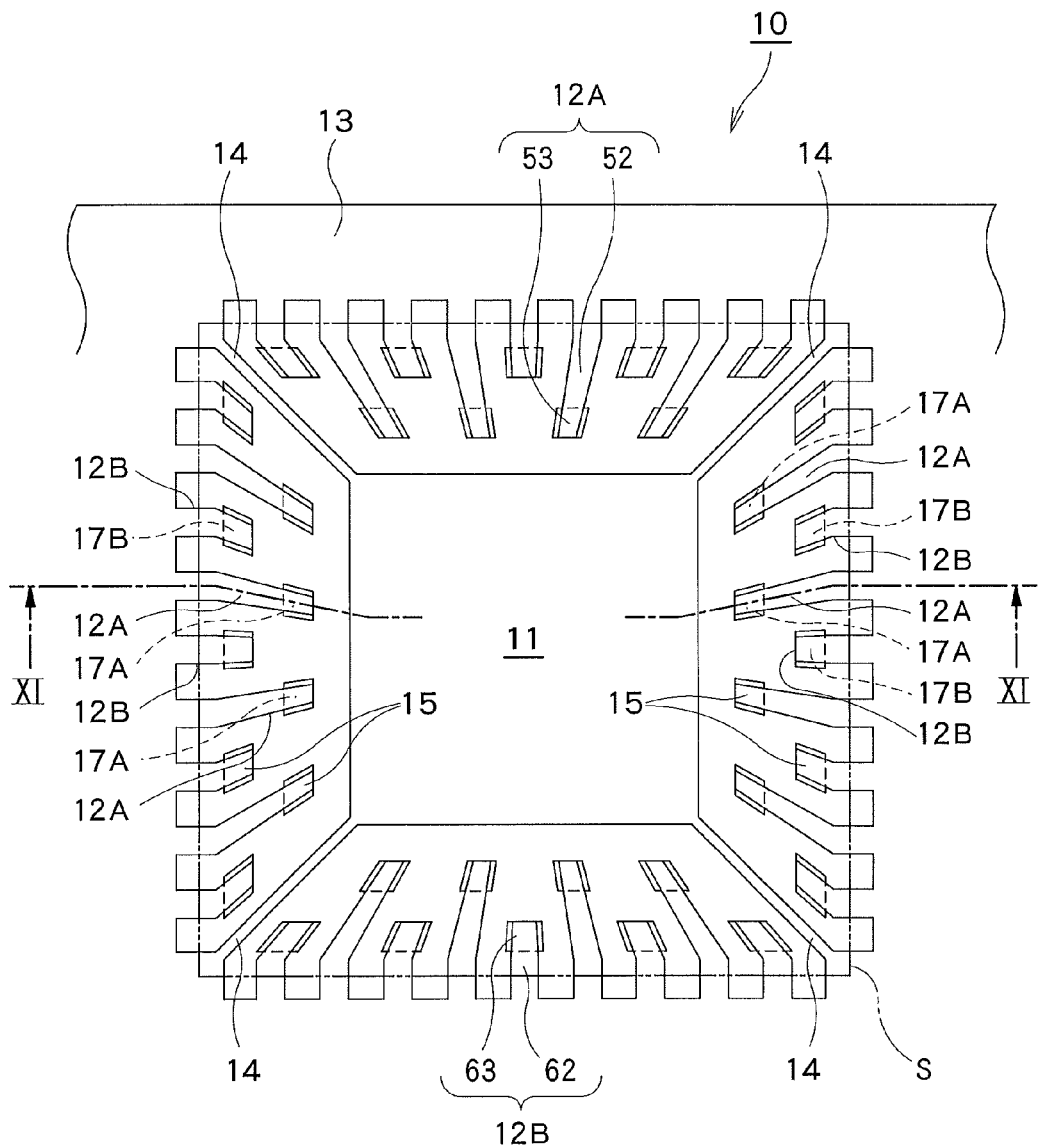
FIG. 10 is a plan view of a lead frame according to a second embodiment of the present invention.
Figure 11:
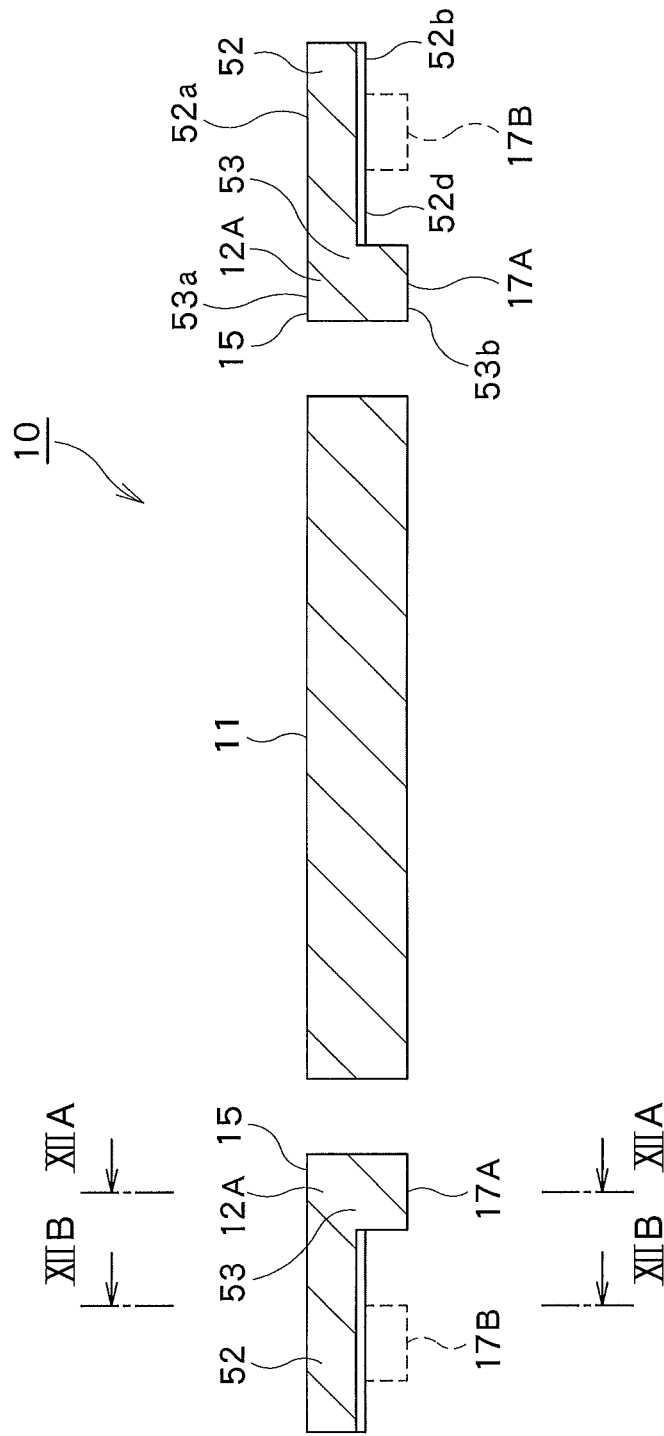
FIG. 11 is a sectional view of the lead frame according to the second embodiment of the present invention (sectional view taken along a line XI-XI of FIG. 10)
Figure 12:
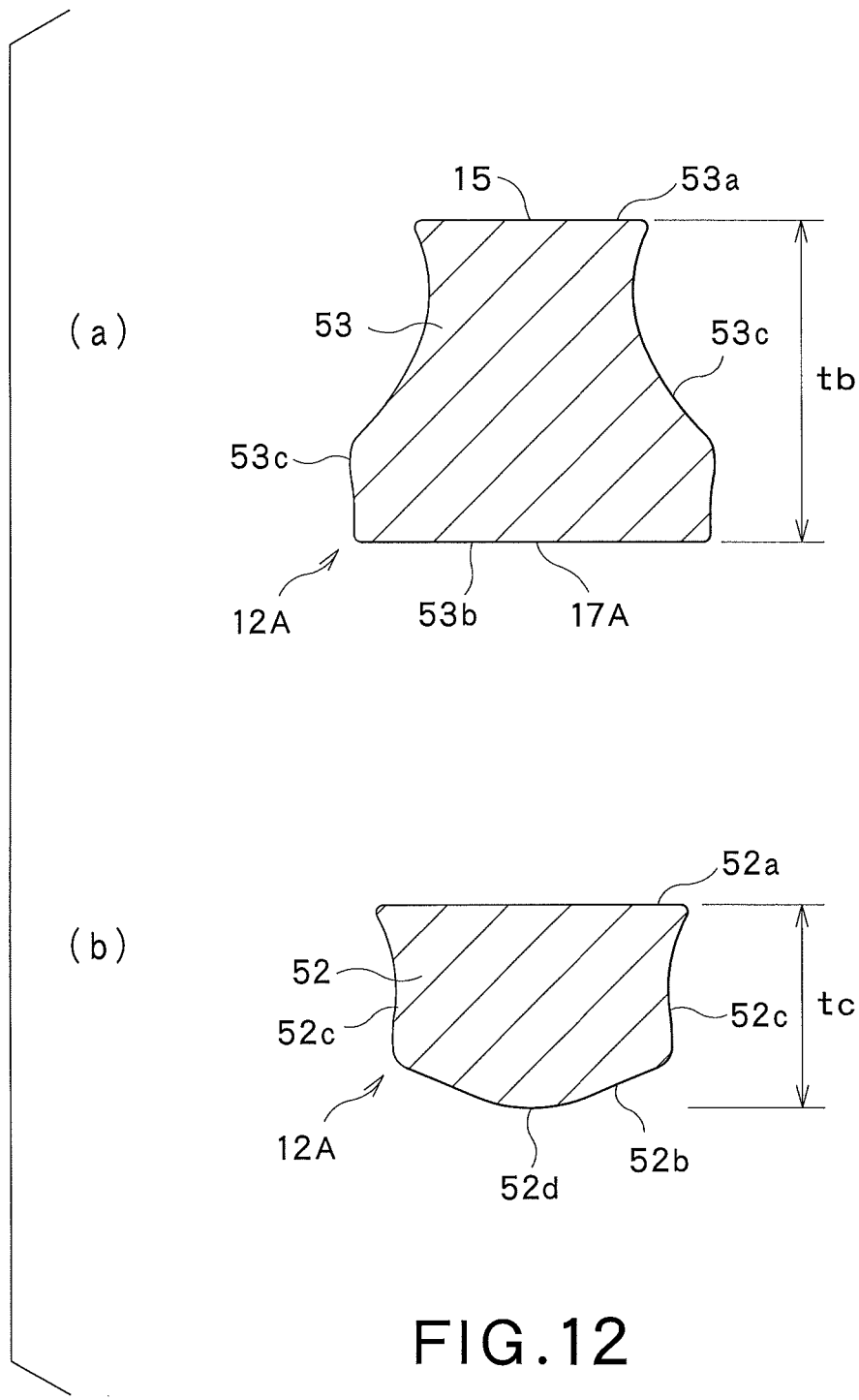
FIGS. 12(a) and 12(b) are sectional views of a lead portion having a first external terminal (the sectional views being a sectional view taken along a line XIIA-XIIA of FIG. 11 and a sectional view taken along a line XIIB-XIIB of FIG. 11, respectively)

In FIG. 10 and FIG. 11, external terminals 17A and 17B (outer lead portions) each electrically connected to an external mounting board (not shown) are formed on the rear surfaces of inner ends of lead portions 12A and 12B. In this case, the external terminals 17A and 17B of the plurality of lead portions 12A and 12B are arranged in an alternately staggered form such that the external terminals 17A and 17B of lead portions 12A and 12B adjacent to each other are located on the inside and the outside, respectively. That is, the lead portions 12A whose external terminals 17A (first external terminals 17A) are relatively located on the inside (die pad 11 side) and the lead portions 12B whose external terminals 17B (second external terminals 17B) are relatively located on the outside (outer frame 13 side) are alternately arranged over the entire periphery of the die pad 11.

Of the plurality of lead portions 12A and 12B, a lead portion 12A having a first external terminal 17A includes an external terminal region 53 located in the inner end of the lead portion 12A (end portion on the die pad 11 side) and an outside region 52 located on the outside of the external terminal region 53 (outer frame 13 side). The outside region 52 out of these regions has an elongate rod shape as viewed in plan. An outer end portion of the outside region 52 is coupled to an outer frame 13. The above-described first external terminal 17A is formed on a rear surface 53b of the external terminal region 53, and an internal terminal 15 (inner lead portion) is formed on a top surface 53a of the external terminal region 53. The internal terminal 15 forms a region electrically connected to a semiconductor element 21 via a bonding wire 22, as will be described later. It is to be noted that unlike the first embodiment the lead portion 12A does not have the inside region 51.

In this case, the outside region 52 of the lead portion 12A is formed thin by means of half etching. On the contrary, the external terminal region 53 is not subjected to the half etching, but has a same thickness as the die pad 11 and the outer frame 13.

Of the plurality of lead portions 12A and 12B, a lead portion 12B having a second external terminal 17B includes an external terminal region 63 located in the inner end of the lead portion 12B (end portion on the die pad 11 side) and an outside region 62 located on the outside of the second external terminal 17B (outer frame 13 side). The outside region 62 out of these regions has an elongate rod shape as viewed in plan. An outside end portion of the outside region 62 is coupled to the outer frame 13. The second external terminal 17B is formed on a rear surface of the external terminal region 63, and an internal terminal 15 (inner lead portion) is formed on a top surface of the external terminal region 63. It is to be noted that unlike the first embodiment the lead portion 12B does not have the inside region 61.

In this case, the outside region 62 of the lead portion 12B is formed thin by means of the half etching. On the contrary, the external terminal region 63 is not subjected to the half etching, but has a same thickness as the die pad 11 and the outer frame 13.

FIGS. 12(a) and 12(b) are each a diagram showing the cross-sectional shape of a lead portion 12A in a direction orthogonal to the longitudinal direction of the lead portion 12A. FIG. 12(a) of the figures is a sectional view of the external terminal region 53 in the lead portion 12A (sectional view taken along a line XIIA-XIIA of FIG. 11). FIG. 12(b) is a sectional view of the outside region 52 in the lead portion 12A (sectional view taken along a line XIIB-XIIB of FIG. 11).

As shown in FIG. 12(a), the external terminal region 53 of the lead portion 12A has the top surface 53a, the first external terminal 17A formed on the rear surface 53b, and a pair of side surfaces 53c partly curved to the inside in a width direction. The internal terminal 15 is formed on the top surface 53a of the external terminal region 53, as described above.

As shown in FIG. 12(b), the outside region 52 of the lead portion 12A has a top surface 52a, a rear surface 52b in which a convexed portion 52d projecting downward (in the direction of the rear surface) is formed by means of the half etching, and a pair of side surfaces 52c. The outside region 52 has a cross section of a substantially pentagonal shape. The substantially pentagonal shape here is not limited to a pentagonal shape in a strict sense, but includes shapes in which the pair of side surfaces 52c is partly curved toward the inside in the width direction, as shown in FIG. 12(b).

Because the outside region 52 of the lead portion 12A thus has the convexed portion 52d projecting in the direction of the rear surface in the cross section orthogonal to the longitudinal direction of the lead portion 12A, the outside region 52 serving as a base part of the lead portion 12A can be unlikely to be deformed. This prevents the lead portion 12A from being deformed while a semiconductor device 20 (to be described later) is being manufactured, and can therefore deter problems including a displacement of the first external terminal 17A and difficulty in wire bonding work.

The cross-sectional shape of the external terminal region 63 of each lead portion 12B having the second external terminal 17B is substantially similar to the cross-sectional shape of the external terminal region 53 of the lead portion 12A described above. On the contrary, the cross-sectional shape of the outside region 62 of the lead portion 12B is different from the cross-sectional shape of the outside region 52 of the lead portion 12A, and is a substantially quadrilateral shape. This is because the length of the outside region 62 of the lead portion 12B is relatively shorter than the length of the outside region 52 of the lead portion 12A and there is thus relatively less fear that the outside region 62 be deformed. However, without being limited to this, the outside region 62 of the lead portion 12B may have a cross section of a substantially pentagonal shape having a convexed portion projecting in the direction of the rear surface as with the outside region 52 of the lead portion 12A.

In other respects, the structures of the external terminal regions 53 and 63 and the outside regions 52 and 62 of the lead portions 12A and 12B are substantially similar to those of the first embodiment. In addition, the operational advantages of having such shapes are substantially similar to those of the first embodiment.

Structure of Semiconductor Device

Figure 13:
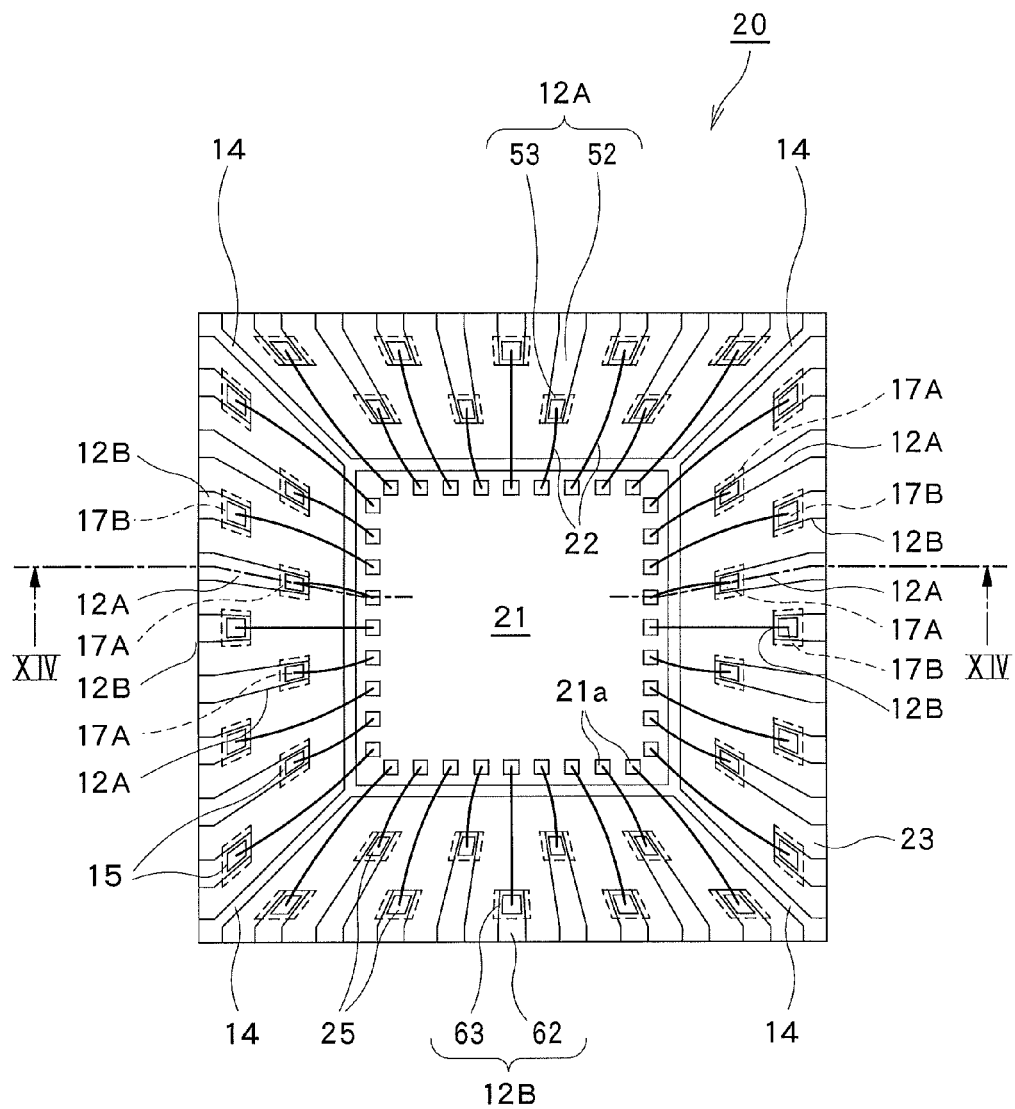
FIG. 13 is a plan view of a semiconductor device according to the second embodiment of the present invention.
Figure 14:
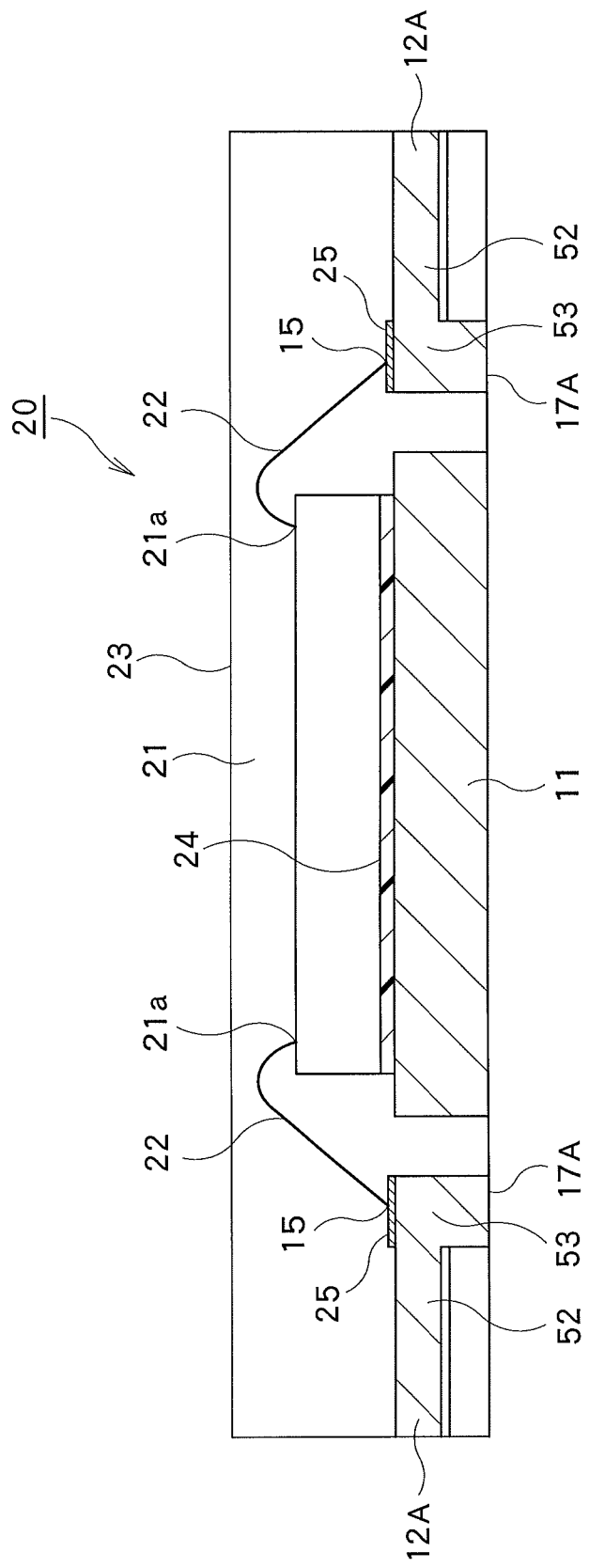
FIG. 14 is a sectional view of the semiconductor device according to the second embodiment of the present invention (sectional view taken along a line XIV-XIV of FIG. 13)
Figure 15:
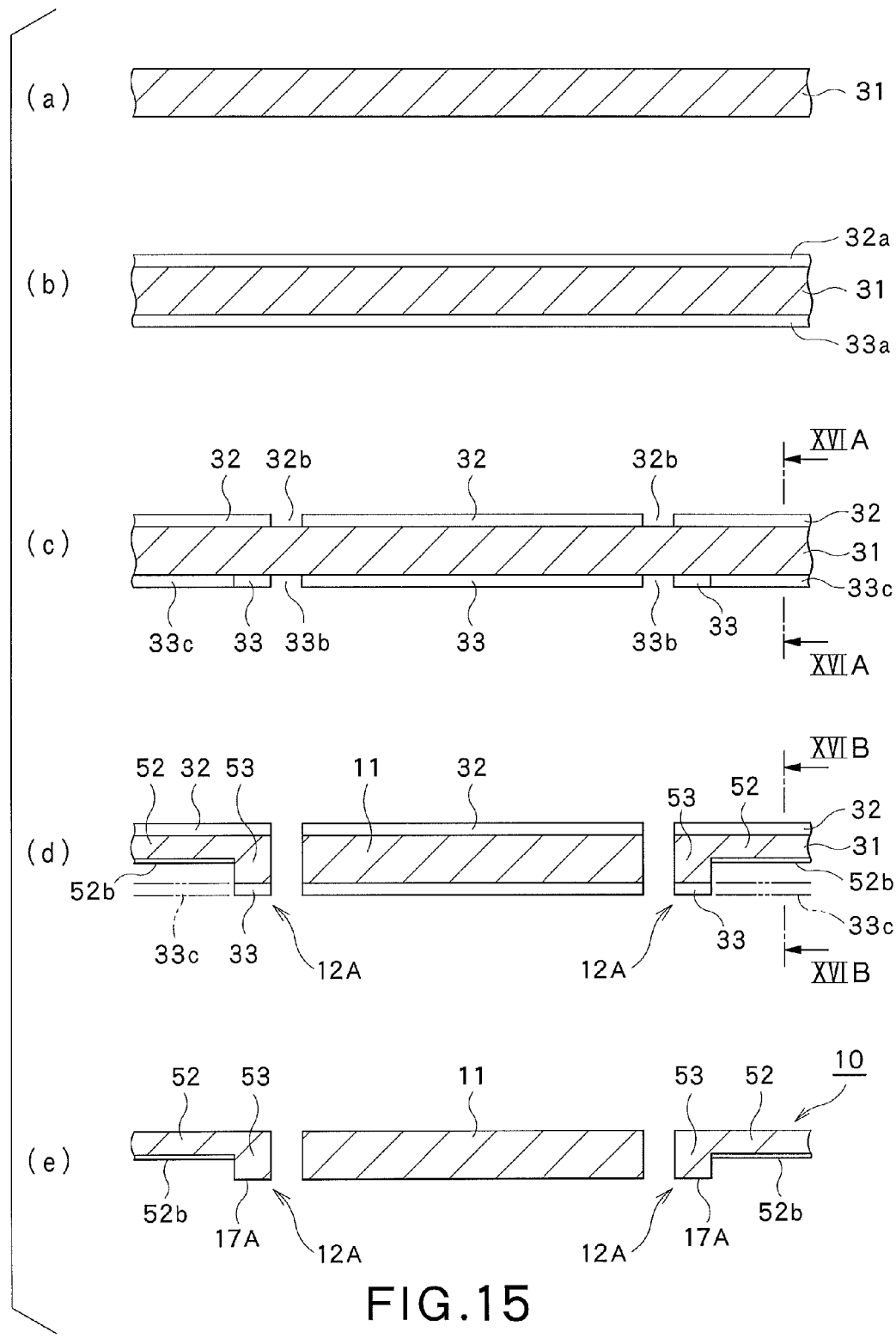
FIGS. 15(a) to 15(e) are sectional views showing a method of manufacturing the lead frame according to the second embodiment of the present invention.
Figure 16:
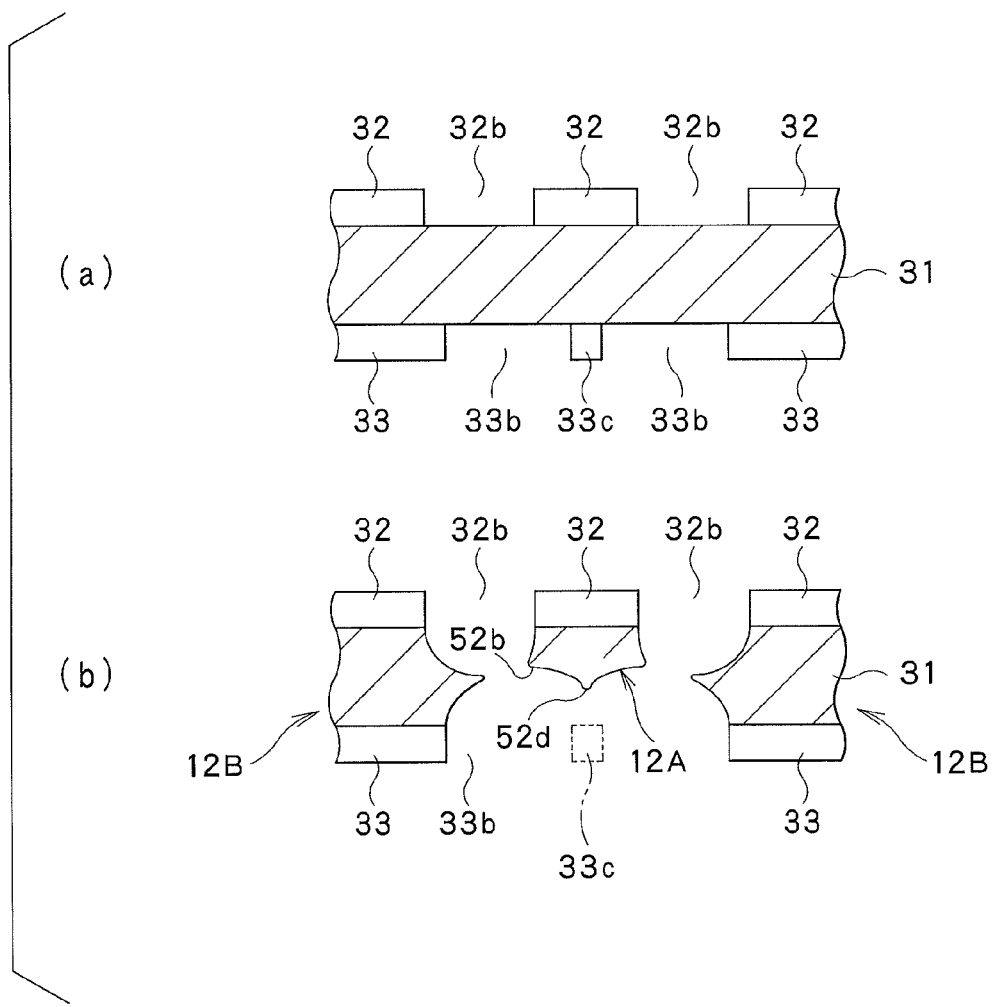
FIGS. 16(a) to 16(b) are sectional views of an outside region of a lead portion in a lead frame manufacturing process (the sectional views being a sectional view taken along a line XVIA-XVIA of FIG. 15(c) and a sectional view taken along a line XVIB-XVIB of FIG. 15(d), respectively)
Figure 17:
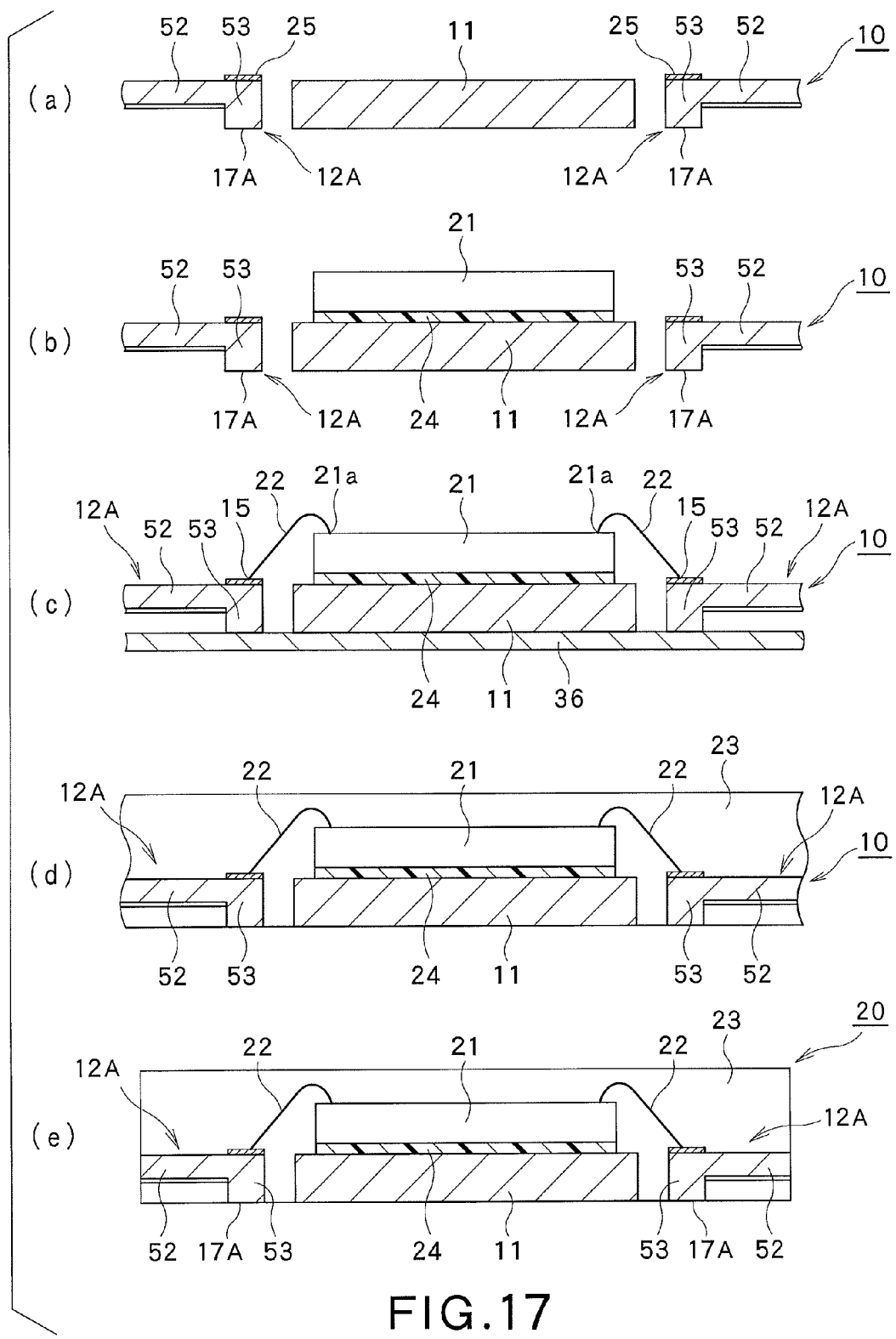
FIGS. 17(a) to 17(e) are sectional views showing a method of manufacturing the semiconductor device according to the second embodiment of the present invention.

A semiconductor device according to the present embodiment will now be described with reference to FIG. 13 and FIG. 14. FIG. 13 and FIG. 14 are diagrams showing the semiconductor device according to the present embodiment {DR-QFN (Dual Row QFN) type}.

In FIG. 13 and FIG. 14, a die pad 11 and lead portions 12A and 12B of the semiconductor device 20 are fabricated from the above-described lead frame 10. The structure of the die pad 11 and the lead portions 12A and 12B is similar to the above-described structure shown in FIGS. 10 to 12(b), and therefore detailed description thereof will be omitted here. Besides, the structure of the semiconductor device 20 is substantially similar to that of the first embodiment.

Method of Manufacturing Lead Frame

A method of manufacturing the lead frame 10 shown in FIGS. 10 to 12(b) will now be described with reference to FIGS. 15(a) to 15(e) and FIGS. 16(a) and 16(b). FIGS. 15(a) to 15(e) are sectional views showing the method of manufacturing the lead frame 10 according to the present embodiment (views corresponding to FIG. 11). FIGS. 16(a) and 16(b) are sectional views of the outside region 52 in the lead portion 12A. FIGS. 16(a) and 16(b) show a section taken along a line XVIA-XVIA of FIG. 15(c) and a section taken along a line XVIB-XVIB of FIG. 15(d), respectively.

A metal substrate 31 is first prepared (FIG. 15(a)) as in the first embodiment. Next, the entire top surface and entire rear surface of the metal substrate 31 are coated with photosensitive resists 32a and 33a, respectively. The photosensitive resists 32a and 33a are then dried (FIG. 15(b)). Next, the metal substrate 31 is exposed to light via a photomask and developed, whereby etching resist layers 32 and 33 having desired opening portions 32b and 33b are formed (FIG. 15(c)).

At this time, the opening portions 33b are provided in advance at positions corresponding to intervals between the die pad 11 and the lead portions 12A and 12B in the etching resist layer 33 formed on the rear surface side of the metal substrate 31 (FIG. 15(c)). Meanwhile, a partial resist 33c is provided in advance at a position corresponding to the outside region 52 of the lead portion 12A in the etching resist layer 33 along the longitudinal direction of the outside region 52 (FIG. 15(c) and FIG. 16(a)).

Next, the metal substrate 31 is etched with an etchant by use of the etching resist layers 32 and 33 employed as corrosion-resistant films (FIG. 15(d)). The external shapes of the die pad 11 and the plurality of lead portions 12A and 12B are thereby formed.

As described above, the partial resist 33c is provided at the position corresponding to the outside region 52 of the lead portion 12A on the rear surface side of the metal substrate 31 (FIG. 16(a)). Thereby, when the metal substrate 31 is etched with an etchant, the etchant goes around from both sides of the partial resist 33c, the rear surface of the metal substrate 31 is half-etched, and a rear surface 52b having a convexed portion 52d is formed (FIG. 16(b)). The partial resist 33c is removed in the middle of the etching as the metal substrate 31 is corroded. Thus, the convexed portion 52d projecting in the direction of the rear surface in the cross section orthogonal to the longitudinal direction of the lead portion is formed in the outside region 52, and the cross-sectional shape of the outside region 52 becomes a substantially pentagonal shape.

In this case, the entire shape of the lead frame 10 is formed in one etching process, and at the same time, the convexed portion 52d projecting downward is formed in the outside region 52 of the lead portion 12A by means of the half etching due to the partial resist 33c. With the partial resist 33c being provided in this manner, the going around of the etchant to the rear surface side of the lead portion 12A is suppressed to some extent. Thus, the thickness $t_c$ of the outside region 52 of the lead portion 12A can be increased (for example exceed 50% of the thickness of the metal substrate 31) as compared with a case where the partial resist 33c is not provided. It is thereby possible to increase the strength of the lead portion 12A, and prevent a problem of the lead portion 12A being deformed.

Although not shown, the lead portions 12B having the second external terminals 17B are also formed at the same time when the metal substrate 31 is etched. The cross-sectional shapes of the outside regions 62 of the lead portions 12B are not particularly limited, but may each be a substantially quadrilateral shape, for example, or may each be a substantially pentagonal shape as in the lead portions 12A.

The etching resist layers 32 and 33 are thereafter peeled off and removed, whereby the lead frame 10 shown in FIGS. 10 to 12(b) is obtained (FIG. 15(e)).

Method of Manufacturing Semiconductor Device

A method of manufacturing the semiconductor device 20 shown in FIG. 13 and FIG. 14 will now be described with reference to FIGS. 17(a) to 17(e).

First, a lead frame 10 is fabricated with the method shown in FIGS. 15(a) to 15(e) and FIGS. 16(a) and 16(b).

Next, internal terminals 15 are plated to form plated portions 25 (FIG. 17(a)). A semiconductor element 21 is then mounted on the die pad 11 of the lead frame 10. In this case, the semiconductor element 21 is mounted and fixed on the die pad 11 by use of for example an adhesive 24 such as a die bonding paste (die attaching process) (FIG. 17(b)).

Next, the terminal portions 21a of the semiconductor element 21 are electrically connected to the internal terminals 15 of lead portions 12A and 12B through bonding wires 22 (wire bonding process) (FIG. 17(c)).

Next, a sealing resin 23 is formed by means of injection molding or transfer molding of a thermosetting resin or a thermoplastic resin on the lead frame 10 (FIG. 17(d)). The lead frame 10, the semiconductor element 21, and the bonding wires 22 are thereby sealed.

Next, the lead frame 10 is separated into lead frame elements of respective semiconductor elements 21 by dicing the sealing resin 23 between the semiconductor elements 21. The semiconductor device 20 shown in FIG. 13 and FIG. 14 is thus obtained (FIG. 17(e)). The method of manufacturing the semiconductor device 20 is substantially similar to that of the first embodiment, and therefore detailed description thereof will be omitted.

As described above, according to the present embodiment, the outside region 52 of the lead portion 12A has the convexed portion 52d projecting downward in the cross section orthogonal to the longitudinal direction of the lead portion 12A, and has a cross-sectional shape of a substantially pentagonal shape. This shape can increase the geometrical moment of inertia of the outside region 52 and strengthen the outside region 52 serving as the base part of the lead portion 12A. It is thereby possible to increase the strength of the lead portion 12A, and prevent a problem of the first external terminal 17A being displaced due to deformation of the lead portion 12A. As a result, the yield of the lead frame 10 can be improved. In particular, even when intervals between the lead portions 12A and the lead portions 12B adjacent to each other are smaller and the width of the lead portions 12A is narrower, it is possible to prevent a decrease in the strength of the lead portions 12A, and prevent a problem of the first external terminals 17A being displaced due to deformation of the lead portions 12A. As a result, the yield of the lead frame 10 can be improved. In other respects, the operational advantages substantially similar to those of the first embodiment are obtained.

(Modification of Second Embodiment)

A modification of the second embodiment of the present invention will now be described with reference to FIGS. 18 to 20(b). FIGS. 18 to 20(b) are diagrams showing a modification of the second embodiment of the present invention. The modification shown in FIGS. 18 to 20(b) is different in terms of the cross-sectional shape of outside regions 52, and is substantially identical to the foregoing first embodiment and the foregoing second embodiment in terms of other structures. In FIGS. 18 to 20(b), the same parts as in the first embodiment and the second embodiment are identified by the same reference numerals, and detailed description thereof will be omitted.

Figure 18:
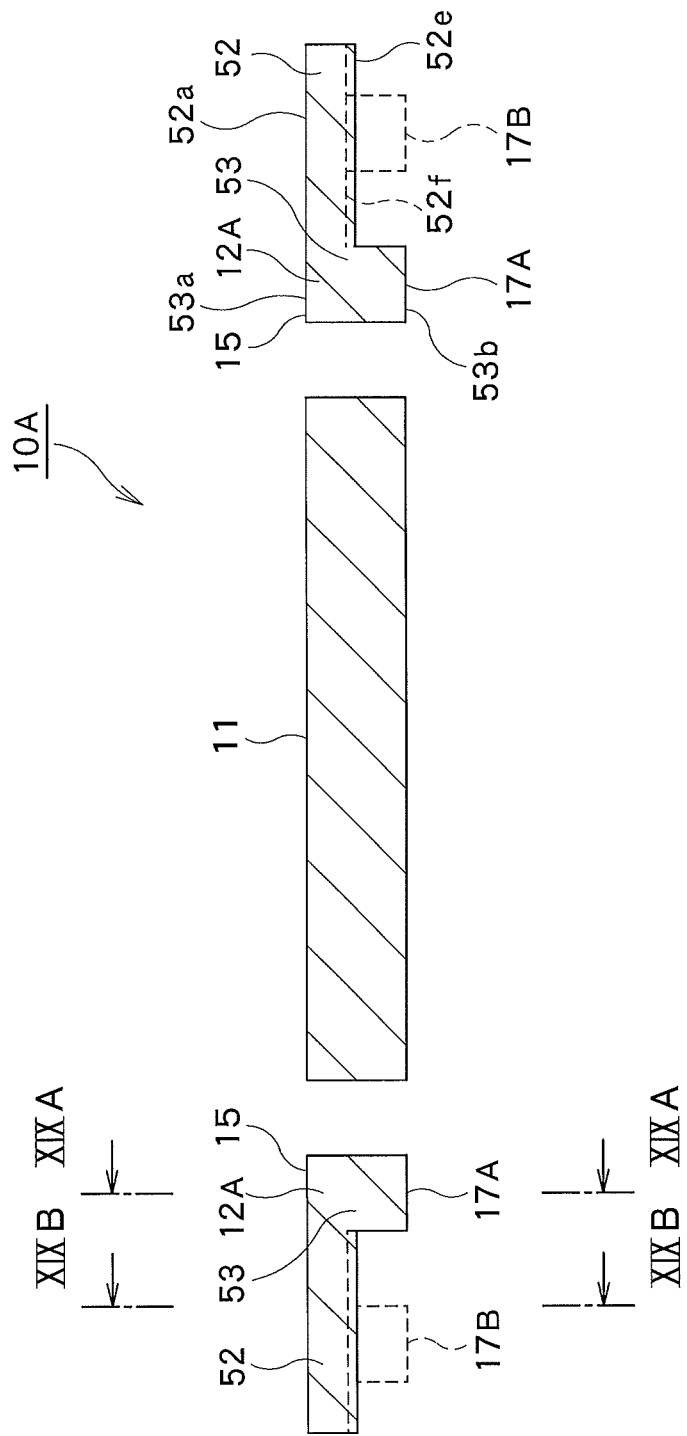
FIG. 18 is a sectional view showing a lead frame according to a modification of the second embodiment of the present invention.
Figure 19:
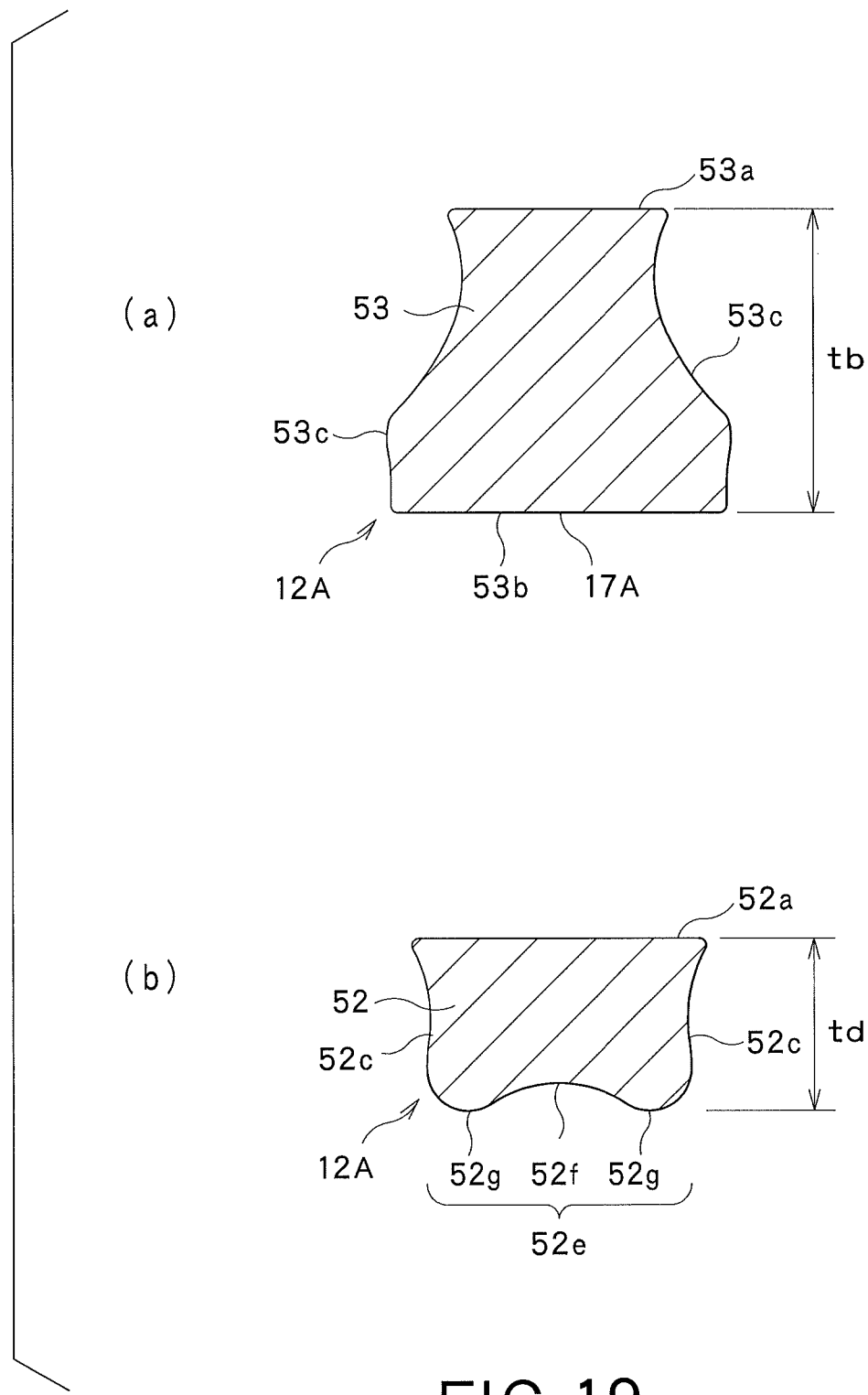
FIGS. 19(a) and 19(b) are sectional views of a lead portion having a first external terminal in the modification of the second embodiment of the present invention (the sectional views being a sectional view taken along a line XIXA-XIXA of FIG. 18 and a sectional view taken along a line XIXB-XIXB of FIG. 18, respectively)
Figure 20:
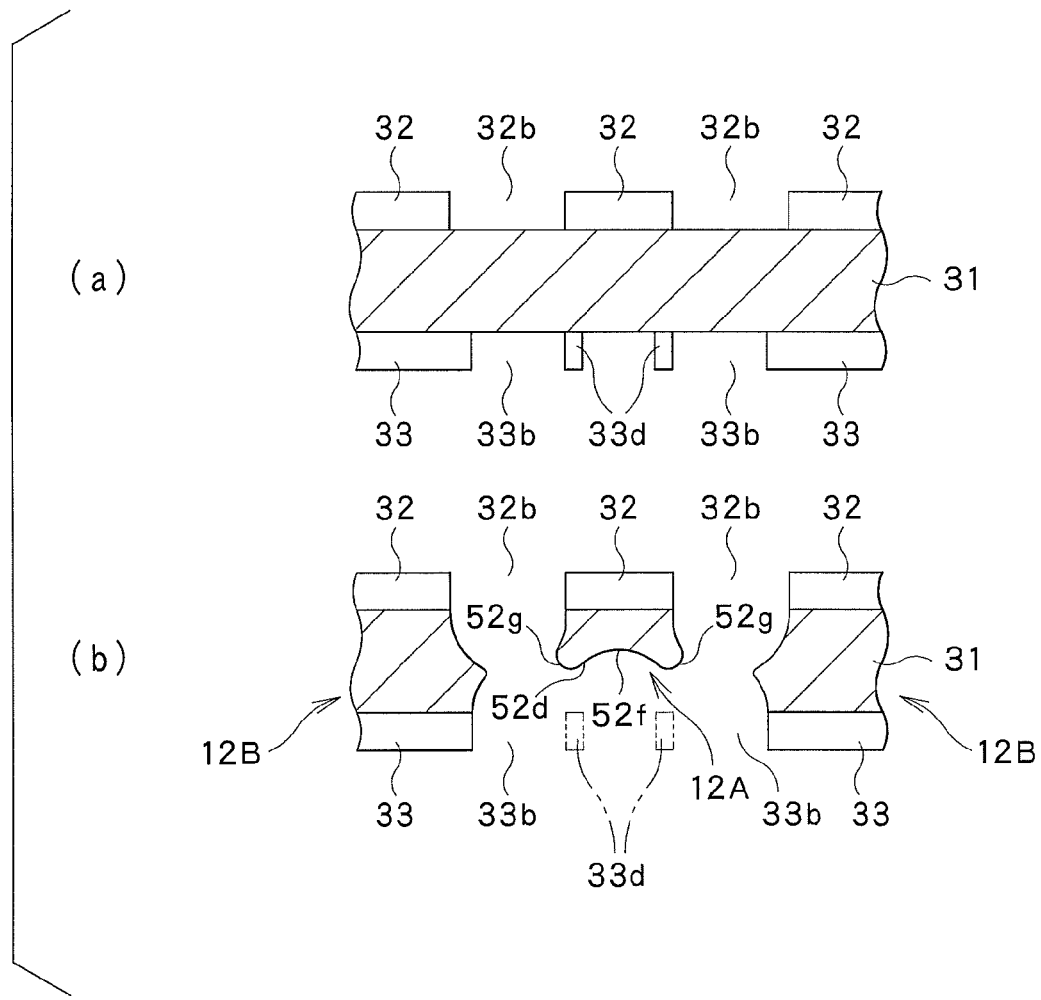
FIGS. 20(a) and 20(b) are sectional views of an outside region of a lead portion in a lead frame manufacturing process according to the modification of the second embodiment of the present invention.

As shown in FIG. 18 and FIGS. 19(a) and 19(b), in a lead frame 10A according to the present modification, an outside region 52 has a recessed portion 52f recessed upward (in a direction of a top surface) in a cross section orthogonal to the longitudinal direction of a lead portion 12A.

As shown in FIG. 19(b), the outside region 52 of the lead portion 12A has a top surface 52a, a rear surface 52e in which the recessed portion 52f is formed by means of half etching, and a pair of side surfaces 52c. The cross section of the outside region 52 has a substantially concave shape including a pair of convexed portions 52g and the recessed portion 52f formed between the pair of convexed portions 52g.

FIG. 18 is a sectional view of the lead frame 10A, and is a view corresponding to FIG. 11. FIG. 19(a) is a sectional view of an external terminal region 53 in the lead portion 12A (sectional view taken along a line XIXA-XIXA of FIG. 18). FIG. 19(b) is a sectional view of the outside region 52 in the lead portion 12A (sectional view taken along a line XIXB-XIXB of FIG. 18).

In FIGS. 19(a) and 19(b), the thickness $t_d$ of the outside region 52 may be for example 50% to 90% of the thickness $t_b$ of the external terminal region 53 (FIG. 19(a)). The thickness $t_d$ here of the outside region 52 refers to a maximum thickness in the cross section of the outside region 52 (thickness measured at a part where a convexed portion 52g is disposed in this case).

Since the outside region 52 of the lead portion 12A has a cross section of a substantially concave shape, the geometrical moment of inertia of the outside region 52 can be increased, and therefore the strength of the outside region 52 serving as a base part of the lead portion 12A can be increased. This shape prevents the lead portion 12A from being deformed while a semiconductor device 20 is being manufactured, and can therefore deter problems such as a displacement of a first external terminal 17A and difficulty in wire bonding work.

When the lead frame 10A shown in FIG. 18 and FIGS. 19(a) and 19(b) is fabricated, a pair of partial resists 33d and 33d is provided in advance at a position corresponding to the outside region 52 of the lead portion 12A in an etching resist layer 33 along the longitudinal direction of the outside region 52 (FIG. 20(a)).

When the metal substrate 31 is thereafter etched with an etchant, the etchant goes around from the peripheries of the pair of partial resists 33d and 33d, the rear surface of the metal substrate 31 is half-etched, and the outside region 52 is formed which has the cross section of a substantially concave shape including the pair of convexed portions 52g and the recessed portion 52f formed between the pair of convexed portions 52g (FIG. 20(b)). The pair of partial resists 33d and 33d is removed in the middle of the etching as the metal substrate 31 is corroded. Thus, the recessed portion 52f recessed in the direction of the top surface in the cross section orthogonal to the longitudinal direction of the lead portion is formed in the outside region 52, and the cross-sectional shape of the outside region 52 becomes a substantially concave shape.

In this case, the entire shape of the lead frame 10 is formed in one etching process, and at the same time, the recessed portion 52f recessed in the direction of the top surface is formed in the outside region 52 of the lead portion 12A by means of the half etching due to the pair of partial resists 33d and 33d. With the pair of partial resists 33d and 33d being provided in this manner, the going around of the etchant to the rear surface side of the lead portion 12A is suppressed to some extent. Thus, the thickness $t_d$ of the outside region 52 of the lead portion 12A can be increased (for example exceed 50% of the thickness of the metal substrate 31) as compared with a case where the partial resists 33d and 33d are not provided. It is thereby possible to increase the strength of the lead portion 12A, and prevent a problem of the lead portion 12A being deformed.

Except for the aforementioned respects, the method of manufacturing the lead frame 10A according to the present modification is similar to the method of manufacturing the lead frame 10 according to the second embodiment (FIGS. 15(a) to 15(e) and FIGS. 16(a) and 16(b)). A semiconductor device fabricated using the lead frame 10A according to the present modification and a method of manufacturing the semiconductor device are substantially similar to those of the second embodiment.

(Third Embodiment)

A third embodiment of the present invention will now be described with reference to FIGS. 21 to 30.

Structure of Lead Frame

Overviews on a lead frame according to the present embodiment will first be described with reference to FIGS. 21 to 24. FIGS. 21 to 24 are diagrams showing the lead frame according to the present embodiment.

The lead frame 110 shown in FIGS. 21 to 24 is used to fabricate a semiconductor device 120 (to be described later). The lead frame 110 includes a die pad 115 and a plurality of long lead portions 116A and a plurality of short lead portions 116B disposed on the periphery of the die pad 115.

The lead frame 110 includes a plurality of lead frame elements 114 arranged longitudinally and laterally in the form of a matrix. Each of the lead frame elements 114 is a region corresponding to individual semiconductor devices 120. The lead frame elements 114 include a die pad 115, a plurality of long lead portions 116A, and a plurality of short lead portions 116B. The regions enclosed by a chain double-dashed line correspond to the lead frame elements 114 in FIG. 21 and FIG. 23.

Each die pad 115 is used for mounting a semiconductor element 121 to be described later. Each die pad 115 has a substantially rectangular planar shape. Each long lead portion 116A and each short lead portion 116B are connected to the semiconductor element 121 via a bonding wire 122, as will be described later. Each long lead portion 116A and each short lead portion 116B are arranged with a space interposed between the die pad 115 and the two portions.

Figure 21:
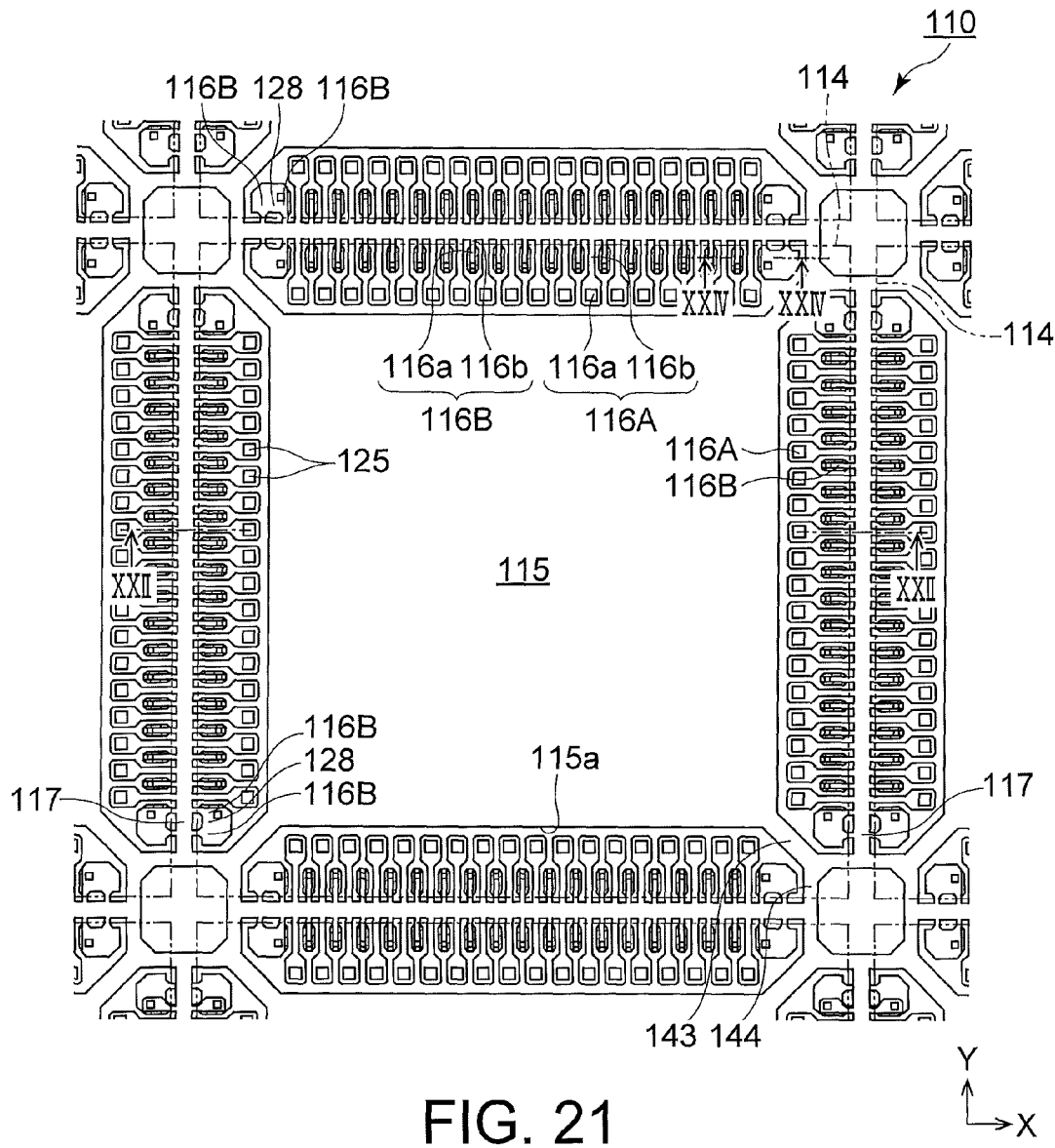
FIG. 21 is a plan view (top surface) of a lead frame according to a third embodiment of the present invention.
Figure 22:
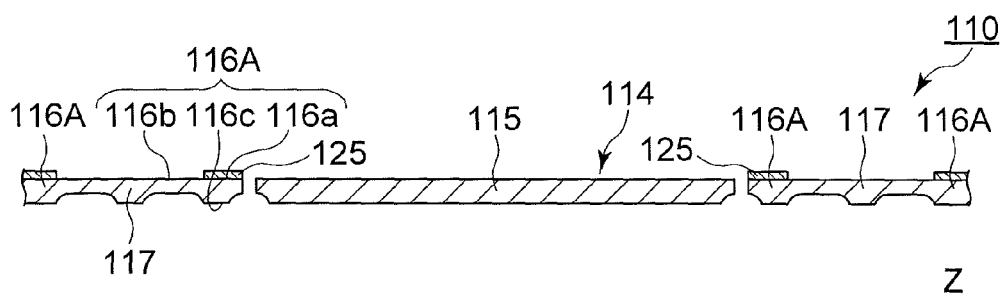
FIG. 22 is a sectional view of the lead frame according to the third embodiment of the present invention (sectional view taken along a line XXII-XXII of FIG. 21)
Figure 23:
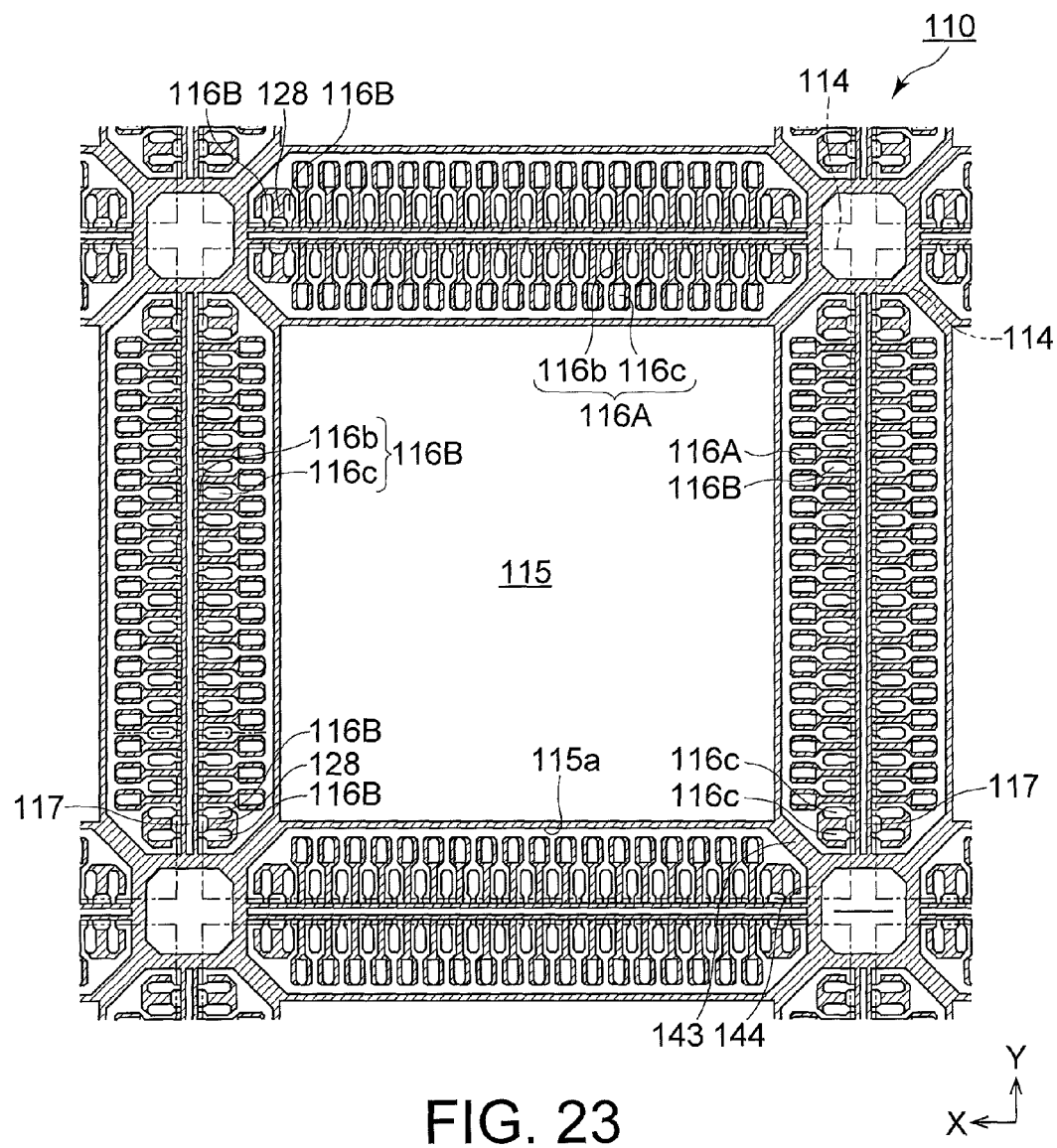
FIG. 23 is a bottom (rear surface) view of the lead frame according to the third embodiment of the present invention.

Each long lead portion 116A and each short lead portion 116B, as shown in FIG. 21 and FIG. 23, extend along one of an X-direction and a Y-direction, and each long lead portion 116A is configured to be longer than each short lead portion 116B. Moreover, each long lead portion 116A and each short lead portion 116B are alternately arranged along the periphery of each side 115a of the die pad 115. However, a pair of short lead portions 116B is disposed so as to be adjacent to each other at each of both end portions of each side 115a of the die pad 115. Internal terminals 116a of each long lead portion 116A and each short lead portion 116B are each provided with a plated portion 125 for improving adhesion to a bonding wire 122.

Each long lead portion 116A and each short lead portion 116B include an internal terminal 116a and a coupling portion 116b. The internal terminal 116a has a relatively large width and is connected to a bonding wire 122. The coupling portion 116b has a relatively small width. An external terminal 116c connected to an external mounting board 145 (see FIG. 30) is provided on the rear surface side of each internal terminal 116a (see FIG. 22). In this case, the internal terminals 116a are arranged in a staggered manner on a top surface side (see FIG. 21), and the external terminals 116c are arranged in a staggered manner on the rear surface side (see FIG. 23).

At least a central part of the die pad 115 is not subjected to half-etching processing but has a thickness equal to that of a metal substrate prior to the processing in the present embodiment. Specifically, the thickness of the central part of the die pad 115, though depending on the structure of the semiconductor device 120, can be 0.1 mm to 0.3 mm. The above-described thickness of 0.10 mm or more can inhibit difficulty in handling the lead frame 110 that has become too thin after being subjected to half etching and further prevent half-etched portions from being too narrow to be filled with a sealing resin. In addition, the above-described thickness of 0.30 mm or less makes intervals between the long lead portions 116A and the short lead portions 116B smaller, enabling the external terminals 116c to be arranged at a high density.

A plurality of connecting bars 117 are arranged in the form of a lattice on the peripheries of the lead frame elements 114. Each of the connecting bars 117 has a different width on the top surface and the rear surface. The width on the top surface side of each connecting bar 117 can be for example 0.15 mm to 0.20 mm. The width on the rear surface side of each connecting bar 117 can be for example 0.03 mm to 0.10 mm.

The die pad 115 in each lead frame element 114 is coupled to the connecting bars 117 via four suspension leads 143 extending from corner portions of the die pad 115 and coupling leads 144 coupled to the respective suspension leads 143.

Further, between lead frame elements 114 adjacent to each other, a pair of corresponding long lead portions 116A is coupled to each other via a connecting bar 117, and a pair of corresponding short lead portions 116B is coupled to each other via the connecting bar 117. Each connecting bar 117 extends so as to be orthogonal to the longitudinal direction of the long lead portions 116A and the short lead portions 116B both coupled to the connecting bar 117. For example, a plurality of long lead portions 116A and a plurality of short lead portions 116B extending in the X-direction are coupled to a connecting bar 117 extending in the Y-direction.

Figure 24:
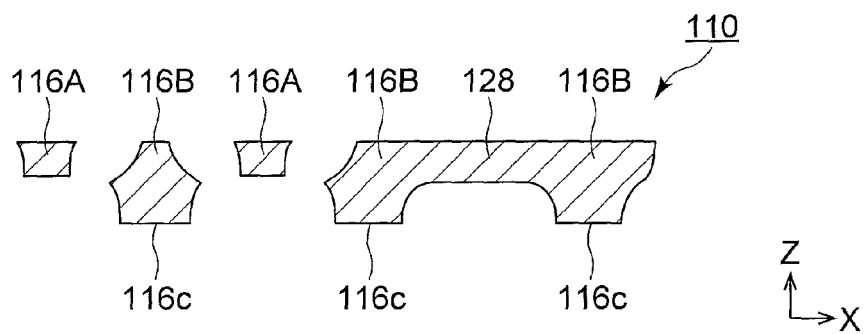
FIG. 24 is a fragmentary sectional view of the lead frame according to the third embodiment of the present invention (sectional view taken along a line XXIV-XXIV of FIG. 21)

In the present embodiment, as shown in FIG. 21, FIG. 23, and FIG. 24, a pair of short lead portions 116B is arranged consecutively so as to be adjacent to each other in the vicinities of both end portions of the sides 115a of the die pad 115. The pair of short lead portions 116B adjacent to each other is coupled to each other through a coupling body 128.

This coupling body 128 is located on the inside of each lead frame element 114. The rear surface of the coupling body 128 is formed thin by means of half etching. The coupling body 128 is accordingly not exposed on the rear surface side of a sealing resin portion 124 (to be described later) after being sealed by the sealing resin portion 124. The external terminals 116c of the pair of short lead portions 116B coupled to each other by the coupling body 128 have planar shapes identical to each other (see FIG. 23). It is thereby possible to prevent the mountability and reliability from being lower as a result of a package being tilted due to the surface tension of solder molten between the external terminals 116c and the external mounting board 145 (see FIG. 30) when the semiconductor device 120 is mounted on the mounting board 145 via these external terminals 116c.

Except for the pair of short lead portions 116B coupled to each other by the coupling body 128, the top surface of each short lead portion 116B has a shape such that both edges in a width direction of each short lead portion 116B are chipped due to etching as shown in FIG. 24. Each of the plurality of short lead portions 116B therefore has a smaller width on the top surface side than a width thereof on the rear surface side. It is thereby possible to widen intervals between the short lead portions 116B and the long lead portions 116A adjacent to each other and prevent short-circuiting of a short lead portion 116B and a long lead portion 116A.

The coupling portions 116b of the plurality of long lead portions 116A are half-etched from the rear surface side as shown in FIG. 24. This half-etching can improve sectility by decreasing stress at a time of sawing (FIG. 29(e)), and reduce an amount of burrs occurring on the peripheries of the long lead portions 116A and the short lead portions 116B at the time of the sawing. It is thereby possible to prevent a long lead portion 116A and a short lead portion 116B adjacent to each other from being short-circuited due to a burr in the semiconductor device 120.

An edge portion in the width direction of a short lead portion 116B located on the side of a long lead portion 116A (on a left side in FIG. 24), the short lead portion 116B being one of the pair of short lead portions 116B coupled by the coupling body 128, is chipped on the top surface side as the result of the etching. It is thereby possible to widen an interval between the short lead portion 116B and the long lead portion 116A adjacent to each other and thus prevent the short-circuiting of the short lead portion 116B and the long lead portion 116A.

Except for the above-described part chipped by the etching, the top surface of the coupling body 128 and the top surfaces of the pair of short lead portions 116B coupled by the coupling body 128 are located on a same plane.

Supposing that the number of a plurality of long lead portions 116A arranged along one side 115a of the die pad 115 is n as in FIG. 21 and FIG. 23, the number of a plurality of short lead portions 116B arranged along the side 115a is n+3. For example, 18 long lead portions 116A and 21 short lead portions 116B are arranged along each side 115a in the present embodiment.

The pair of short lead portions 116B coupled to each other by the coupling body 128 may be used as a power supply terminal or a ground terminal.

The half-etched parts are indicated by hatching in FIG. 21 and FIG. 23. The half etching refers to etching a metal sheet as a material to be etched partway in a direction of thickness of the metal sheet.

Such a lead frame 110 is formed as a result of etching one metal substrate. Materials for the lead frame 110 include copper, a copper alloy, and a 42 alloy (Fe alloy containing 42% Ni).

Structure of Semiconductor Device

Figure 25:
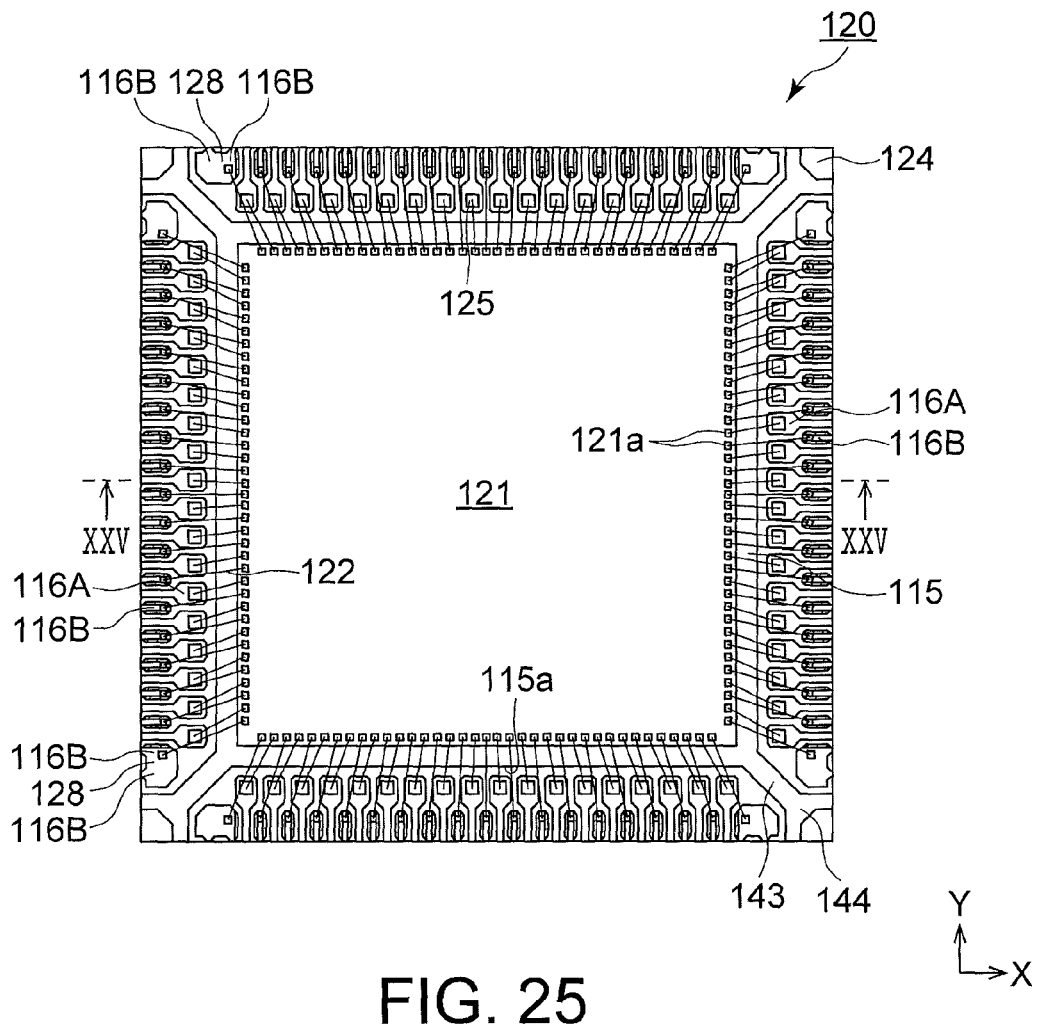
FIG. 25 is a plan (top surface) view of a semiconductor device according to the third embodiment of the present invention.
Figure 26:
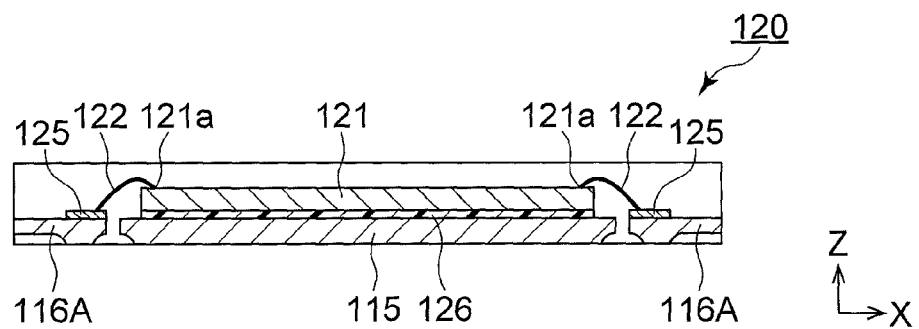
FIG. 26 is a sectional view of the semiconductor device according to the third embodiment of the present invention (sectional view taken along a line XXV-XXV of FIG. 25)
Figure 27:
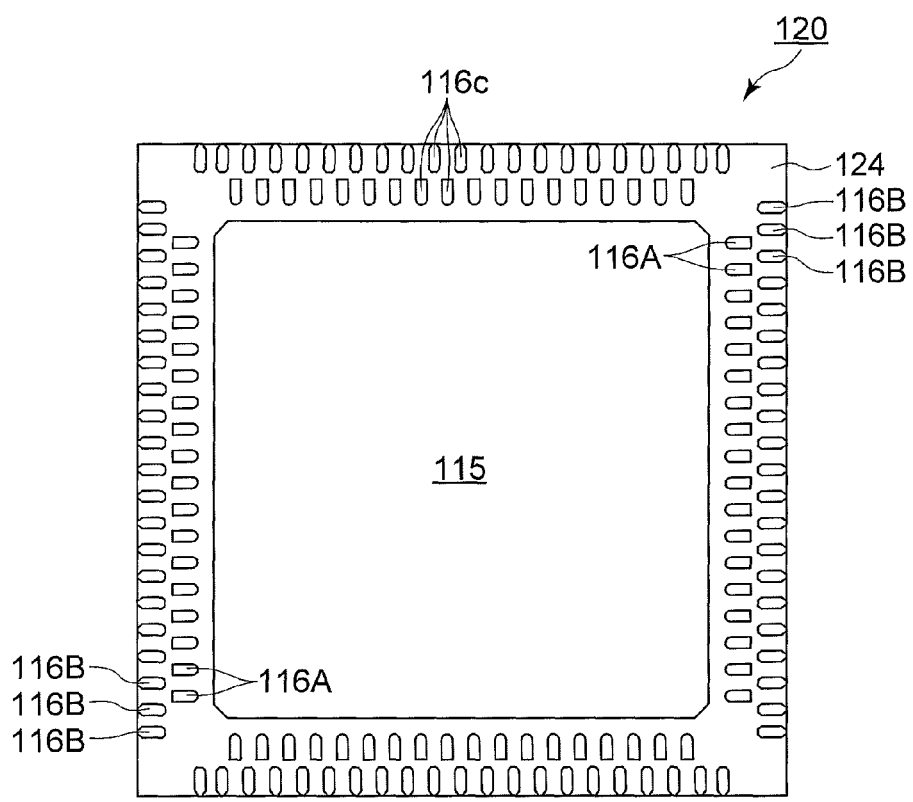
FIG. 27 is a bottom (rear surface) view of the semiconductor device according to the third embodiment of the present invention.
Figure 28:
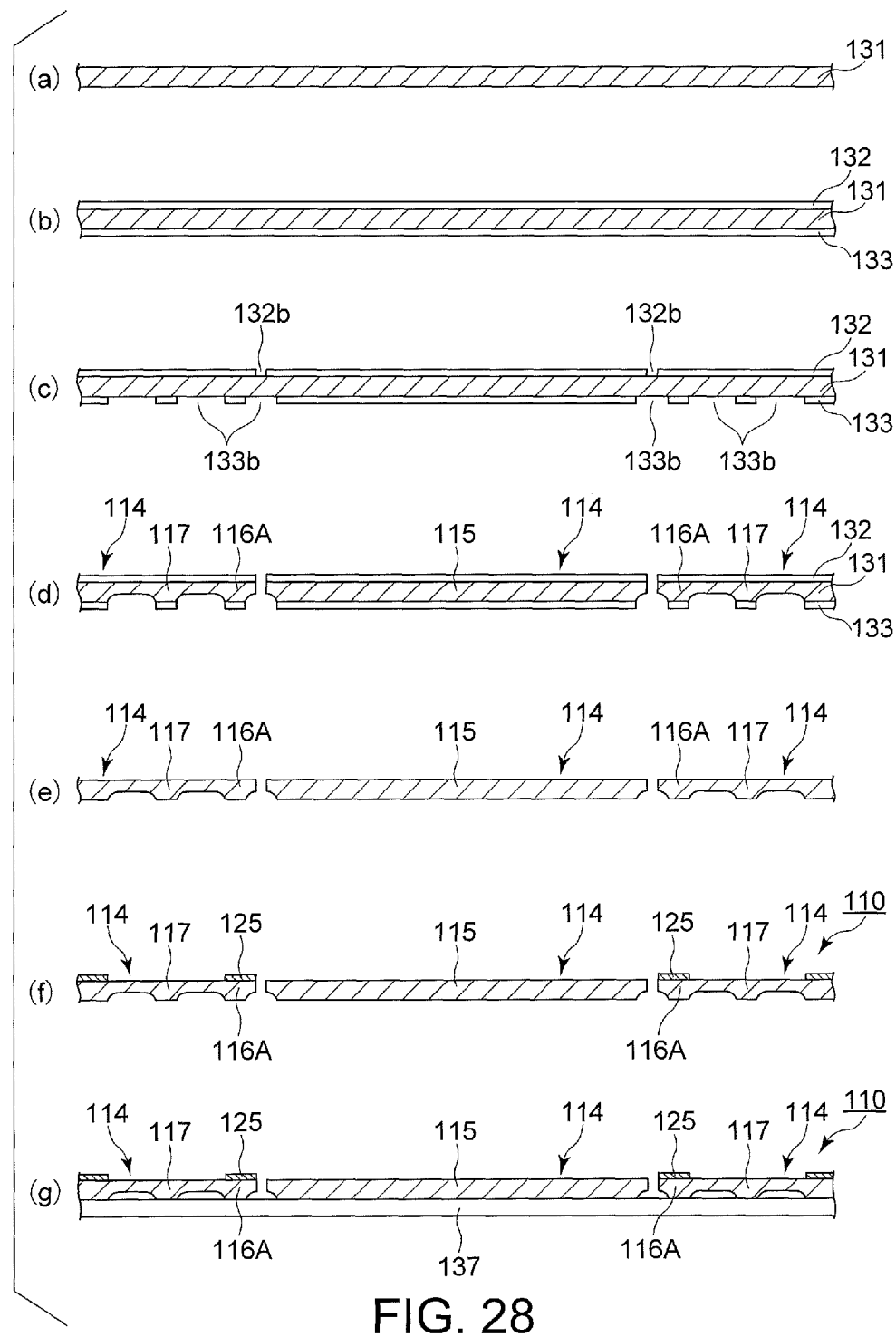
FIGS. 28(a) to 28(g) are sectional views showing a method of manufacturing the lead frame according to the third embodiment of the present invention.
Figure 29:
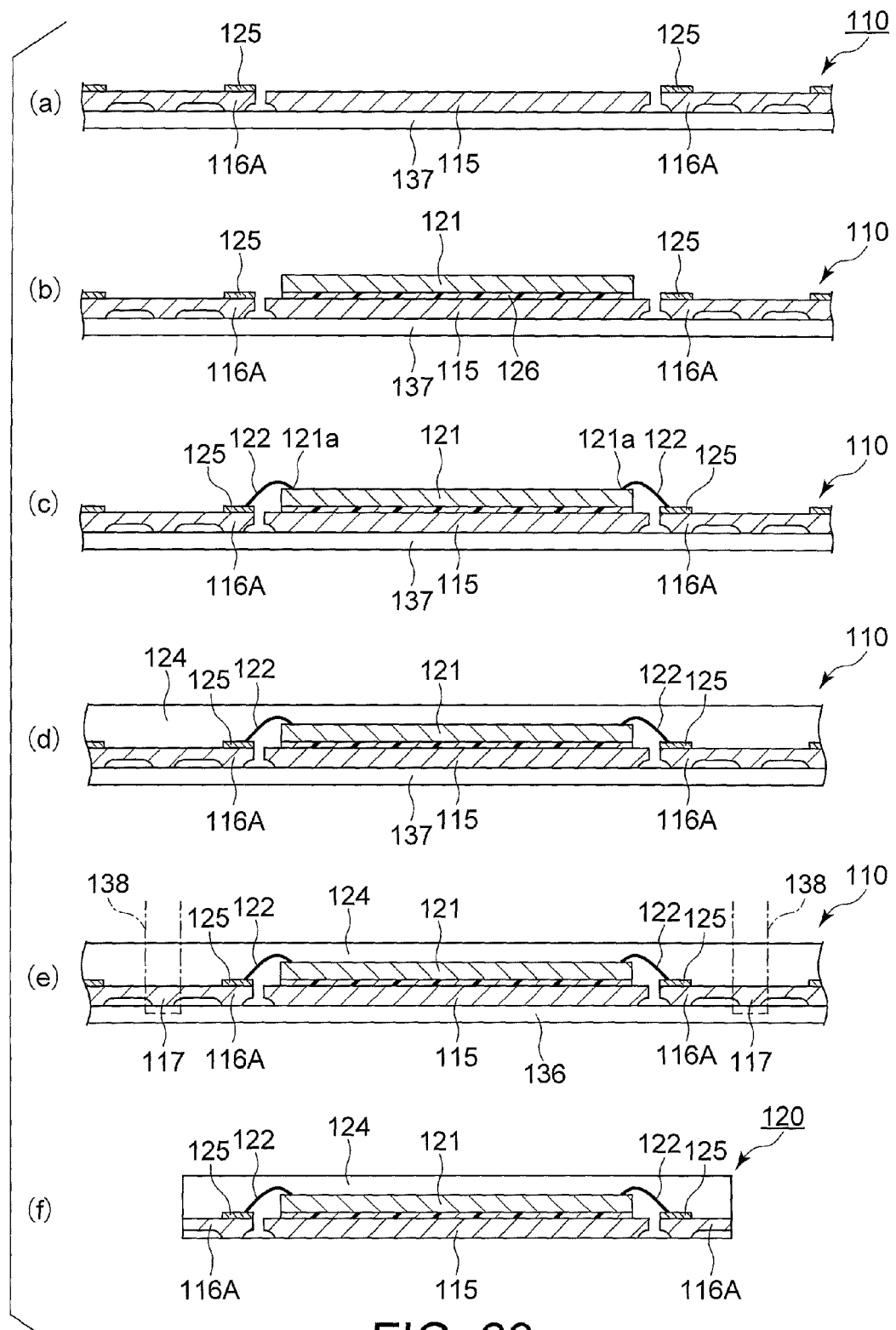
FIGS. 29(a) to 29(f) are sectional views showing a method of manufacturing the semiconductor device according to the third embodiment of the present invention.

A semiconductor device fabricated with the lead frame according to the present embodiment will now be described with reference to FIGS. 25 to 27. FIGS. 25 to 27 are diagrams showing a semiconductor device 120 fabricated with the lead frame 110 according to the present embodiment.

The semiconductor device 120 shown in FIGS. 25 to 27 {DR-QFN (Dual Row QFN) package} includes: a die pad 115; a plurality of long lead portions 116A and a plurality of short lead portions 116B; a semiconductor element 121 mounted on the die pad 115; and bonding wires (connection portions) 122 for electrically connecting the long lead portions 116A and the short lead portions 116B to the terminal portions 121a of the semiconductor element 121.

The die pad 115, the long lead portions 116A, the short lead portions 116B, the semiconductor element 121, and the bonding wires 122 are sealed with a sealing resin portion 124.

The die pad 115, the long lead portions 116A, the short lead portions 116B, and coupling bodies 128 are similar to those included in the above-described lead frame 110 (FIGS. 21 to 24). The configuration of the die pad 115, the long lead portions 116A, the short lead portions 116B, and the coupling bodies 128 has already been described, and therefore detailed description thereof will be omitted here.

Though the semiconductor element 121 is not particularly limited, for example an integrated circuit, a large-scale integrated circuit, a transistor, a thyristor, or a diode can be used as the semiconductor element 121.

The semiconductor element 121 is fixed on the die pad 115 by means of, for example, a fixing material 126 such as a die bonding paste. If the fixing material 126 is made of a die bonding paste, a die bonding paste made from an epoxy resin or a silicone resin, for example, can be selected as the fixing material 126.

Each of the bonding wires 122 is formed of, for example, a material having high electric conductivity such as gold. The bonding wires 122 have one end connected to the terminal portions 121a of the semiconductor element 121 and the other end connected to the long lead portions 116A and the short lead portions 116B.

For example an epoxy resin or a silicone resin can be used as the sealing resin portion 124. The sealing resin portion 124, shown as a transparent sealing resin portion for convenience in FIG. 25, may be formed of an opaque black resin or the like.

Method of Manufacturing Lead Frame

A method of manufacturing the lead frame 110 shown in FIGS. 21 to 24 will now be described with reference to FIGS. 28(a) to 28(g). FIGS. 28(a) to 28(g) which are sectional views showing the method of manufacturing the lead frame according to the present embodiment correspond to FIG. 22.

First, as shown in FIG. 28(a), a flat metal substrate 131 is prepared. A metal substrate formed of a metal such as copper, a copper alloy, and a 42 alloy (Fe alloy containing 42% Ni) can be used as the metal substrate 131, as described above. A substrate both surfaces of which are degreased, for example, and cleaned is preferably used as the metal substrate 131. In addition, the thickness of the metal substrate 131 may be 0.1 mm to 0.3 mm, for example.

Next, the entire top surface and entire rear surface of the metal substrate 131 are coated with photosensitive resists 132a and 133a, respectively. The photosensitive resists 132a and 133a are then dried (FIG. 28(b)). Incidentally, conventionally publicly known photosensitive resists can be used as the photosensitive resists 132a and 133a.

Next, the metal substrate 131 is exposed to light via a photomask and developed, whereby etching resist layers 132 and 133 having desired opening portions 132b and 133b are formed (FIG. 28(c)).

Specifically, the opening portions 132b and 133b are formed at positions corresponding to and parts to be subjected to half etching such as the rear surfaces of coupling bodies 128 (hatched parts in FIG. 21 and FIG. 23) on the top surface side and the rear surface side of the metal substrate 131 in addition to parts to be subjected to through-etching.

Next, the metal substrate 131 is etched with an etchant with the etching resist layers 132 and 133 used as corrosion-resistant films (FIG. 28(d)). An appropriate etchant can be selected in accordance with a material used for the metal substrate 131. For example, when copper is used as the metal substrate 131, a ferric chloride aqueous solution is normally used, and spray etching can be performed from both surfaces of the metal substrate 131.

A die pad 115 on which to mount a semiconductor element 121 and a plurality of long lead portions 116A and a plurality of short lead portions 116B provided on the periphery of the die pad 115 are each formed in the metal substrate 131 accordingly. At this time, a pair of short lead portions 116B is formed so as to be adjacent to each other in the vicinities of both end portions of sides 115a of the die pad 115, and the pair of short lead portions 116B is coupled to each other through a coupling body 128.

Next, the etching resist layers 132 and 133 are peeled off and removed (FIG. 28(e)).

Next, in order to improve adhesion to bonding wires 122, the internal terminals 116a of the long lead portions 116A and the short lead portions 116B are each plated to form a plated portion 125 (FIG. 28(f)). In this case, a selected plating species may be any kind as long as the adhesion to the bonding wires 122 can be ensured. For example, the plating may be a single-layer plating of Ag or Au, or may be a multiple-layer plating formed by laminating Ni and Pd or Ni, Pd, and Au in this order. In addition, the plating portions 125 may be applied onto only connection portions of the internal terminals 116a connected to the bonding wires 122, or may be applied over the entire surface of the lead frame 110. The lead frame 110 shown in FIGS. 21 to 24 is thus obtained.

Next, the lead frame 110 is mounted and fixed on a back tape 137 (FIG. 28(g)).

Method of Manufacturing Semiconductor Device

A method of manufacturing the semiconductor device 120 shown in FIGS. 25 to 27 will now be described with reference to FIGS. 29(a) to 29(f). FIGS. 29(a) to 29(f) are sectional views showing the method of manufacturing the semiconductor device according to the present embodiment.

First, a lead frame 110 including a die pad 115 and a plurality of long lead portions 116A and a plurality of short lead portions 116B provided on the periphery of the die pad 115 is fabricated in the above-described process (FIGS. 28(a) to 28(g)) (FIG. 29(a)). At this time, the lead frame 110 is mounted on a back tape 137.

Next, the semiconductor element 121 is mounted on the die pad 115 of the lead frame 110. In this case, the semiconductor element 121 is mounted and fixed on the die pad 115 by use of for example a fixing material 126 such as a die bonding paste (die attaching process) (FIG. 29(b)).

Next, the terminal portions 121a of the semiconductor element 121 are electrically connected to the short lead portions 116B and the long lead portions 116A of the lead frame 110 by means of bonding wires 122 (wire bonding process) (FIG. 29(c)).

Thereafter, the die pad 115, the long lead portions 116A, the short lead portions 116B, the semiconductor element 121, and the bonding wires 122 are sealed with a sealing resin portion 124 (FIG. 29(d)).

Next, the back tape 137 is peeled off, and a new back tape 136 is stuck to the rear surface of the lead frame 110.

Next, connecting bars 117 between lead frame elements 114 are sawed, whereby the lead frame 110 is separated into each lead frame element 114 (FIG. 29(e)).

At this time, the connecting bars 117 and the sealing resin portion 124 between the lead frame elements 114 are cut by moving a blade 138 formed by for example a diamond wheel along the longitudinal direction of the connecting bars 117. The width of the blade 138 is preferably the same as or larger than the width of the connecting bars 117 for the sake of smooth cutting.

The semiconductor device 120 shown in FIG. 25 and FIG. 26 can be thus obtained (FIG. 29(f)).

Operational Advantages of Present Embodiment

Figure 30:
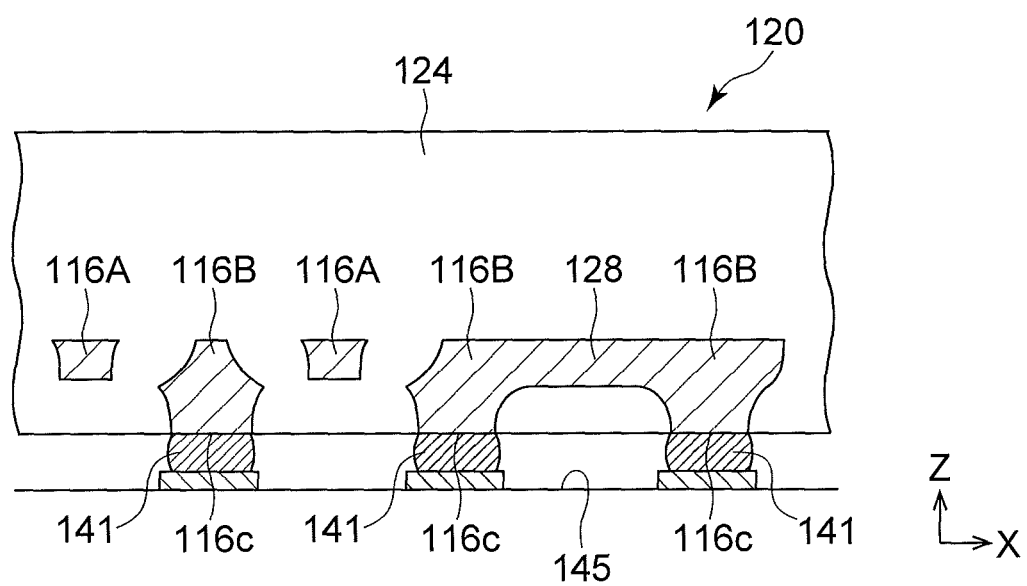
FIG. 30 is a fragmentary sectional view showing a state in which the semiconductor device according to the third embodiment of the present invention is mounted on a mounting board.

The operation of the present embodiment having such a structure will now be described with reference to FIG. 30. FIG. 30 is a sectional view showing a status in which the semiconductor device according to the present embodiment is mounted on a mounting board.

The semiconductor device 120 according to the present embodiment is disposed and mounted on a mounting board 145 formed mainly of a glass epoxy resin as shown in FIG. 30. In this case, the semiconductor device 120 is fixed and mounted on the mounting board 145 by solder portions 141 provided on the external terminals 116c of the long lead portions 116A and the external terminals 116c of the short lead portions 116B. FIG. 30 shows only the solder portions 141 provided to the external terminals 116c of the short lead portions 116B.

Various kinds of heat is expected to be applied to the semiconductor device 120 when the semiconductor device 120 is mounted on the mounting board 145 by solder or due to a usage environment after the semiconductor device 120 is mounted on the mounting board 145. In this case, the semiconductor device 120 repeats thermal contraction due to the heat applied to the semiconductor device 120, such that thermal contraction stress is applied between the semiconductor device 120 and the mounting board 145. At this time, a crack occurs in a solder portion 141 located between a short lead portion 116B provided in the vicinity of an end portion of each side 115a of the die pad 115 (corner portion of the semiconductor device 120), in particular, and the mounting board 145. There is thus a fear that the solder portion 141 be damaged or be subjected to interfacial peeling.

On the contrary, according to the present embodiment, a pair of short lead portions 116B adjacent to each other which short lead portions 116B are arranged in the vicinity of the end portions of each side 115a of the die pad 115 is coupled to each other by means of a coupling body 128. The pair of short lead portions 116B can thus receive the thermal contraction stress via the coupling body 128 when a thermal contraction stress is applied between the semiconductor device 120 and the mounting board 145. Therefore, the problem of the solder portion 141 being damaged or subjected to interfacial peeling can be suppressed as compared with a case where the thermal contraction stress concentrates on one short lead portion 116B.

(Modifications of Third Embodiment)

The foregoing embodiment has been described by taking as an example a case where the lead frame 110 has the plurality of long lead portions 116A and the plurality of short lead portions 116B, the long lead portions 116A and the short lead portions 116B being arranged alternately along the periphery of each side 115a of the die pad 115 except for both end portions of each side 115a of the die pad 115. However, without being limited to this, the lead frame 110 may have a plurality of lead portions having lengths identical to each other. And a pair of lead portions adjacent to each other which lead portions are arranged in the vicinities of the end portions of each side 115a of the die pad 115 may be coupled to each other through a coupling body 128. Alternatively, the lead frame 110 may have a plurality of lead portions whose length is gradually larger from the center of each side 115a to both end portions thereof. And a pair of lead portions adjacent to each other which are arranged in the vicinities of the end portions of each side 115a of the die pad 115 may be coupled to each other through a coupling body 128.

The plurality of long lead portions 116A and the plurality of short lead portions 116B are arranged along the peripheries of the four sides 115a of the die pad 115 in the foregoing embodiment. However, without being limited to this, the plurality of long lead portions 116A and the plurality of short lead portions 116B may be arranged along only the peripheries of one of the four sides 115a, e.g., the peripheries of two sides 115a opposed to each other.

In addition, two coupling bodies 128 for each of four corner portions of the die pad 115, that is, a total of eight coupling bodies 128 are provided in each lead frame element 114 in the foregoing embodiment. However, the foregoing embodiment is not limited to this. For example, only a pair of short lead portions 11613 located in the vicinity of one end portion of each side 115a of the die pad 115 may be coupled to each other through a coupling body 128. In this case, one coupling body 128 for each of the four corner portions of the die pad 115, that is, a total of four coupling bodies 128 may be provided.

What is claimed is:

1. A lead frame comprising:
a die pad on which a semiconductor element is to be mounted; and
a plurality of lead portions provided on a periphery of the die pad, the plurality of lead portions each including an internal terminal and an external terminal,
wherein the external terminal of the plurality of lead portions is arranged in an alternately staggered form such that the external terminal of a pair of lead portions adjacent to each other is alternatively located on an inside or an outside,
wherein the plurality of lead portions each having an inside region located on an inside of the external terminal, an outside region located on an outside of the external terminal, and an external terminal region having the external terminal formed on a rear surface of the external terminal region,
wherein the inside region and the outside region of the lead portion, bearing at least the external terminal on the inside, each having a rear surface formed in such a manner that the inside region and the outside region are thinner than the external terminal region, and
wherein a maximum thickness of the outside region of the lead portion with the external terminal located on the inside is larger than a maximum thickness of the inside region of the lead portion with the external terminal located on the inside.

2. The lead frame according to claim 1,
wherein the inside region of the lead portion with the external terminal located on the inside bears a flat rear surface and having substantially quadrilateral shape in a cross section orthogonal to a longitudinal direction of the lead portion with the external terminal located on the inside.

3. The lead frame according to claim 1,
wherein the outside region of the lead portion with the external terminal located on the inside having a convexed portion projecting downward in a cross section orthogonal to a longitudinal direction of the lead portion with the external terminal located on the inside.

4. The lead frame according to claim 3,
wherein the outside region of the lead portion with the external terminal located on the inside having a substantially pentagonal shape in the cross section orthogonal to the longitudinal direction of the lead portion with the external terminal located on the inside.

5. The lead frame according to claim 1,
wherein the external terminal of the plurality of lead portions having a larger width than a top surface of the external terminal region.

6. A semiconductor device comprising:
a die pad;
a plurality of lead portions provided on a periphery of the die pad, the plurality of lead portions each including an internal terminal and an external terminal;
a semiconductor element mounted on the die pad;
a bonding wire for electrically connecting the semiconductor element to the internal terminal of the lead portions; and
a sealing resin for sealing the die pad, the lead portions, the semiconductor element, and the bonding wire,
wherein the external terminal of the plurality of lead portions is arranged in an alternately staggered form such that the external terminal of a pair of lead portions adjacent to each other is alternatively located on an inside or an outside, wherein the plurality of lead portions each having an inside region located on the inside of the external terminal, an outside region located on the outside of the external terminal, and an external terminal region having the external terminal formed on a rear surface of the external terminal region, wherein the inside region and the outside region of the lead portion, bearing at least the external terminal on the inside, each having a rear surface formed in such a manner that the inside region and the outside region are thinner than the external terminal region, and wherein a maximum thickness of the outside region of the lead portion with the external terminal located on the inside is larger than a maximum thickness of the inside region of the lead portion with the external terminal located on the inside.

7. The semiconductor device according to claim 6,
wherein the inside region of the lead portion with the external terminal located on the inside having a flat rear surface and having a substantially quadrilateral shape in a cross section orthogonal to a longitudinal direction of the lead portion.

8. The semiconductor device according to claim 6,
wherein the outside region of the lead portion with the external terminal located on the inside having a convexed portion projecting downward in a cross section orthogonal to a longitudinal direction of the lead portion with the external terminal located on the inside.

9. The semiconductor device according to claim 8,
wherein the outside region of the lead portion with the external terminal located on the inside having substantially pentagonal shape in the cross section orthogonal to the longitudinal direction of the lead portion with the external terminal located on the inside.

10. The semiconductor device according to claim 6,
wherein the external terminal of the plurality of lead portions each having a larger width than a top surface of the external terminal region.

11. A lead frame comprising:
a die pad on which a semiconductor element is to be mounted; and
a plurality of lead portions provided on a periphery of the die pad, the plurality of lead portions each including an external terminal located at an inner end of the lead portion, wherein the external terminal of the plurality of lead portions is arranged in an alternately staggered form such that the external terminal of a pair of lead portions adjacent to each other is alternatively located on an inside or an outside, wherein the plurality of lead portions each having an outside region located on the outside of the external terminal and an external terminal region having the external terminal formed on a rear surface of the external terminal region, and wherein the outside region of the lead portion, bearing at least the external terminal on the inside, having a rear surface formed in such a manner that the outside region is thinner than the external terminal region, the outside region bearing a convexed portion projecting in a direction of the rear surface or a recessed portion recessed in a direction of a top surface in a cross section orthogonal to a longitudinal direction of the lead portion with the external terminal located on the inside.

12. The lead frame according to claim 11,
wherein the outside region of the lead portion with the external terminal located on the inside having a substantially pentagonal shape in the cross section orthogonal to the longitudinal direction of the lead portion with the external terminal located on the inside.

13. The lead frame according to claim 11,
wherein the outside region of the lead portion with the external terminal located on the inside having a substantially concave shape in the cross section orthogonal to the longitudinal direction of the lead portion with the external terminal located on the inside.

14. The lead frame according to claim 11,
wherein the external terminal of the plurality of lead portions having a larger width than a top surface of the external terminal region.

15. A semiconductor device comprising:
a die pad;
a plurality of lead portions provided on a periphery of the die pad, the plurality of lead portions each including an external terminal located at an inner end of the lead portion;
a semiconductor element mounted on the die pad;
a bonding wire for electrically connecting the semiconductor element to the lead portions; and
a sealing resin for sealing the die pad, the lead portions, the semiconductor element, and the bonding wire, wherein the external terminal of the plurality of lead portions is arranged in an alternately staggered form such that the external terminal of a pair of lead portions adjacent to each other is alternatively located on an inside or an outside, wherein the plurality of lead portions each having an outside region located on the outside of the external terminal and an external terminal region having the external terminal formed on a rear surface of the external terminal region, and wherein the outside region of the lead portion bearing at least the external terminal on the inside having a rear surface formed in such a manner that the outside region is thinner than the external terminal region, the outside region bearing a convexed portion projecting in a direction of the rear surface or a recessed portion recessed in a direction of a top surface in a cross section orthogonal to a longitudinal direction of the lead portion with the external terminal located on the inside.

16. The semiconductor device according to claim 15,
wherein the outside region of the lead portion with the external terminal located on the inside having a substantially pentagonal shape in the cross section orthogonal to the longitudinal direction of the lead portion with the external terminal located on the inside.

17. The semiconductor device according to claim 15,
wherein the outside region of the lead portion with the external terminal located on the inside having a substantially concave shape.

18. The semiconductor device according to claim 15,
wherein the external terminal of the plurality of lead portions having a larger width than a top surface of the external terminal region.

19. A lead frame for a semiconductor device, the lead frame comprising:
a rectangular die pad on which a semiconductor element is to be mounted; and
a plurality of lead portions provided on a periphery of the die pad,
wherein the plurality of lead portions are arranged along a side of the die pad, and
wherein a pair of lead portions adjacent to each other is coupled to each other through a coupling body located within a lead frame element, which is a region corresponding to the semiconductor device, the pair of lead portions being arranged in a vicinity of an end portion of the side of the die pad.

20. The lead frame according to claim 19,
wherein a rear surface of the coupling body is formed by means of half etching such that the coupling body has a small thickness.

21. The lead frame according to claim 19,
wherein a rear surface of the pair of lead portions is each provided with an external terminal, and the external terminal of the pair of lead portions has planar shape identical to each other.

22. A lead frame for a semiconductor device, the lead frame comprising:
a rectangular die pad on which a semiconductor element is to be mounted; and
a plurality of long lead portions and a plurality of short lead portions provided on a periphery of the die pad,
wherein the plurality of long lead portions and the plurality of short lead portions are arranged along a side of the die pad, and
wherein a pair of short lead portions is arranged so as to be adjacent to each other in a vicinity of an end portion of the side of the die pad, the pair of short lead portions being coupled to each other through a coupling body located within a lead frame element, which is region corresponding to the semiconductor device.

23. The lead frame according to claim 22,
wherein a rear surface of the coupling body is formed by means of half etching such that the coupling body has a small thickness.

24. The lead frame according to claim 22,
wherein a rear surface of the pair of short lead portions is each provided with an external terminal, and the external terminal of the pair of short lead portions has planar shape identical to each other.

25. The lead frame according to claim 22,
wherein at least one of the plurality of short lead portions has a smaller width on a top surface side than a width on a rear surface side.

26. The lead frame according to claim 22,
wherein supposing that a number of the plurality of long lead portions arranged along the side of the die pad is n, a number of the plurality of short lead portions arranged along the side of the die pad is n+3.

27. A semiconductor device comprising:
a rectangular die pad;
a plurality of lead portions provided on a periphery of the die pad;
a semiconductor element mounted on the die pad;
a connection portion for electrically connecting the semiconductor element to the lead portions; and
a sealing resin portion for sealing the die pad, the lead portions, the semiconductor element, and the connection portion;
wherein the plurality of lead portions are arranged along a side of the die pad, and
wherein a pair of lead portions adjacent to each other is coupled to each other through a coupling body, the pair of lead portions being arranged in a vicinity of an end portion of the side of the die pad.

28. A semiconductor device comprising:
a rectangular die pad;
a plurality of long lead portions and a plurality of short lead portions provided on a periphery of the die pad;
a semiconductor element mounted on the die pad;
a connection portion for electrically connecting the semiconductor element to the plurality of long lead portions or the plurality of short lead portions; and
a sealing resin portion for sealing the die pad, the plurality of long lead portions, the plurality of short lead portions, the semiconductor element, and the connection portion;
wherein the plurality of long lead portions and the plurality of short lead portions are arranged along a side of the die pad, and
wherein a pair of short lead portions is arranged so as to be adjacent to each other in a vicinity of an end portion of the side of the die pad, the pair of short lead portions being coupled to each other through a coupling body.

29. A lead frame for a semiconductor device, the lead frame comprising:
a die pad on which a semiconductor element is to be mounted; and
a plurality of lead portions provided on a periphery of the die pad;
wherein the plurality of lead portions adjacent to each other, the plurality of lead portions being arranged in a vicinity of a corner portion of a region corresponding to the semiconductor device, are coupled to each other through a coupling body having a rear surface formed such that the coupling body has a small thickness.

30. A lead frame for a semiconductor device, the lead frame comprising:
a die pad on which a semiconductor element is to be mounted; and
a plurality of long lead portions and a plurality of short lead portions provided on a periphery of the die pad,
wherein a plurality of short lead portions are arranged so as to be adjacent to each other in a vicinity of a corner portion of a region corresponding to the semiconductor device, the plurality of short lead portions being coupled to each other through a coupling body having a rear surface formed such that the coupling body has a small thickness.

* * * * *